US012633893B2

(12) United States Patent
Takata

(10) Patent No.: US 12,633,893 B2
(45) Date of Patent: May 19, 2026

(54) FILTER AND MULTIPLEXER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 205 days.

(21) Appl. No.: 18/506,180

(22) Filed: Nov. 10, 2023

(65) Prior Publication Data

US 2024/0080010 A1     Mar. 7, 2024

Related U.S. Application Data

(63) Continuation of application No. PCT/JP2022/020047, filed on May 12, 2022.

(30) Foreign Application Priority Data

May 17, 2021     (JP) ................................. 2021-083353

(51) Int. Cl.
*H03H 9/05*          (2006.01)
*H03H 3/02*          (2006.01)
(Continued)

(52) U.S. Cl.
CPC ............ *H03H 9/0566* (2013.01); *H03H 3/02* (2013.01); *H03H 9/542* (2013.01); *H03H 9/605* (2013.01)

(58) Field of Classification Search
CPC ........ H03H 9/0566; H03H 3/02; H03H 9/542; H03H 9/605; H03H 9/568; H03H 9/6436;
(Continued)

(56) References Cited

U.S. PATENT DOCUMENTS 10,476,482 B2 *  11/2019  Niwa ........................ H04B 1/18
2004/0196119 A1    10/2004  Shibahara et al.
(Continued)

FOREIGN PATENT DOCUMENTS

JP        2004282707 A      10/2004
JP        2014171210 A      9/2014
(Continued)

OTHER PUBLICATIONS

International Search Report in PCT/JP2022/020047, mailed Jul. 19, 2022, 3 pages.
(Continued)

*Primary Examiner* — Andrea Lindgren Baltzell
*Assistant Examiner* — Kimberly E Glenn
(74) *Attorney, Agent, or Firm* — Keating & Bennett, LLP

(57) ABSTRACT

A filter includes a substrate including a piezoelectric layer, and first and second signal electrodes, a filter circuit on a first path connecting the first signal electrode and the second signal electrode, and an additional circuit on a second path connected in parallel with at least a portion of the first path. The filter circuit includes one or more resonators and a main wiring line on the substrate, and the additional circuit includes a sub-wiring line and an acoustically coupled resonator on the substrate, the acoustically coupled resonator including acoustic wave resonators adjacent to each other. An insulating film is between the substrate and the sub-wiring line. A dielectric constant of the insulating film is smaller than a dielectric constant of the piezoelectric layer.

20 Claims, 12 Drawing Sheets

(51) Int. Cl.
    *H03H 9/54*         (2006.01)
    *H03H 9/60*         (2006.01)

(58) Field of Classification Search
    CPC ...... H03H 9/706; H03H 9/6483; H03H 9/725;
                        H03H 9/02559; H03H 9/72
    See application file for complete search history.

(56)               References Cited

U.S. PATENT DOCUMENTS

| | | | |
|---|---|---|---|
| 2008/0061657 A1* | 3/2008 | Matsuda | H03H 9/0038 |
| | | | 333/186 |
| 2017/0099043 A1 | 4/2017 | Goto et al. | |
| 2018/0131348 A1 | 5/2018 | Takahashi | |
| 2019/0356298 A1 | 11/2019 | Kawasaki | |

FOREIGN PATENT DOCUMENTS

| | | | |
|---|---|---|---|
| JP | 2017092945 A | 5/2017 | |
| JP | 2018078489 A | 5/2018 | |
| JP | 2018166340 A | 10/2018 | |
| JP | 2019121873 A | 7/2019 | |
| WO | 2018143044 A1 | 8/2018 | |

OTHER PUBLICATIONS

Written Opinion in PCT/JP2022/020047, mailed Jul. 19, 2022, 3 pages.

\* cited by examiner

FILTER AND MULTIPLEXER

CROSS REFERENCE TO RELATED APPLICATIONS

This application claims the benefit of priority to Japanese Patent Application No. 2021-083353 filed on May 17, 2021 and is a Continuation Application of PCT Application No. PCT/JP2022/020047 filed on May 12, 2022. The entire contents of each application are hereby incorporated herein by reference.

BACKGROUND OF THE INVENTION

1. Field of the Invention

The present invention relates to a filter and a multiplexer including a filter.

2. Description of the Related Art

In the related art, a filter having a predetermined frequency band as a pass band is known. As an example of such a filter, Japanese Unexamined Patent Application Publication No. 2018-166340 discloses a filter including a filter circuit and an additional circuit connected in parallel with the filter circuit.

In the filter disclosed in Japanese Unexamined Patent Application Publication No. 2018-166340, the additional circuit is used to cancel unnecessary waves outside the pass band. However, in this filter, a signal leakage path may occur between wiring of the additional circuit and wiring of the filter circuit. Thus, there is a problem that attenuation outside the pass band of the filter cannot be secured.

SUMMARY OF THE INVENTION

Preferred embodiments of the present invention provide filters each ensuring attenuation outside a pass band of the filter.

A filter according to a preferred embodiment of the present invention includes a substrate including a piezoelectric layer and a first signal electrode and a second signal electrode, a filter circuit on a first path connecting the first signal electrode and the second signal electrode, and an additional circuit on a second path connected in parallel with at least a portion of the first path, wherein the filter circuit includes one or more resonators and a main wiring line that are provided on the substrate, the additional circuit includes a sub-wiring line and an acoustically coupled resonator that are provided on the substrate, the acoustically coupled resonator including a plurality of acoustic wave resonators adjacent to each other, an insulating film is provided between the substrate and the sub-wiring line, and a dielectric constant of the insulating film is smaller than a dielectric constant of the piezoelectric layer.

Additionally, a multiplexer according to a preferred embodiment of the present invention includes a filter according to a preferred embodiment of the present invention, and another filter having bandpass characteristics different from those of the filter.

In addition, a filter according to a preferred embodiment of the present invention includes a substrate including a piezoelectric layer, and a first signal electrode and a second signal electrode, a filter circuit on a first path connecting the first signal electrode and the second signal electrode, and an additional circuit on a second path connected in parallel with at least a portion of the first path, wherein the filter circuit includes one or more resonators and a main wiring line that are provided on the substrate, the additional circuit includes a sub-wiring line and an acoustically coupled resonator that are provided on the substrate, the acoustically coupled resonator including a plurality of acoustic wave resonators adjacent to each other, an insulating film is provided between the substrate and the sub-wiring line, the insulating film includes, as a main component, at least one of silicon oxide, silicon nitride, silicon oxynitride, or polyimide or a combination thereof, and the piezoelectric layer includes lithium niobate or lithium tantalate.

According to preferred embodiments of the present invention, attenuation outside a pass band of a filter can be ensured.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
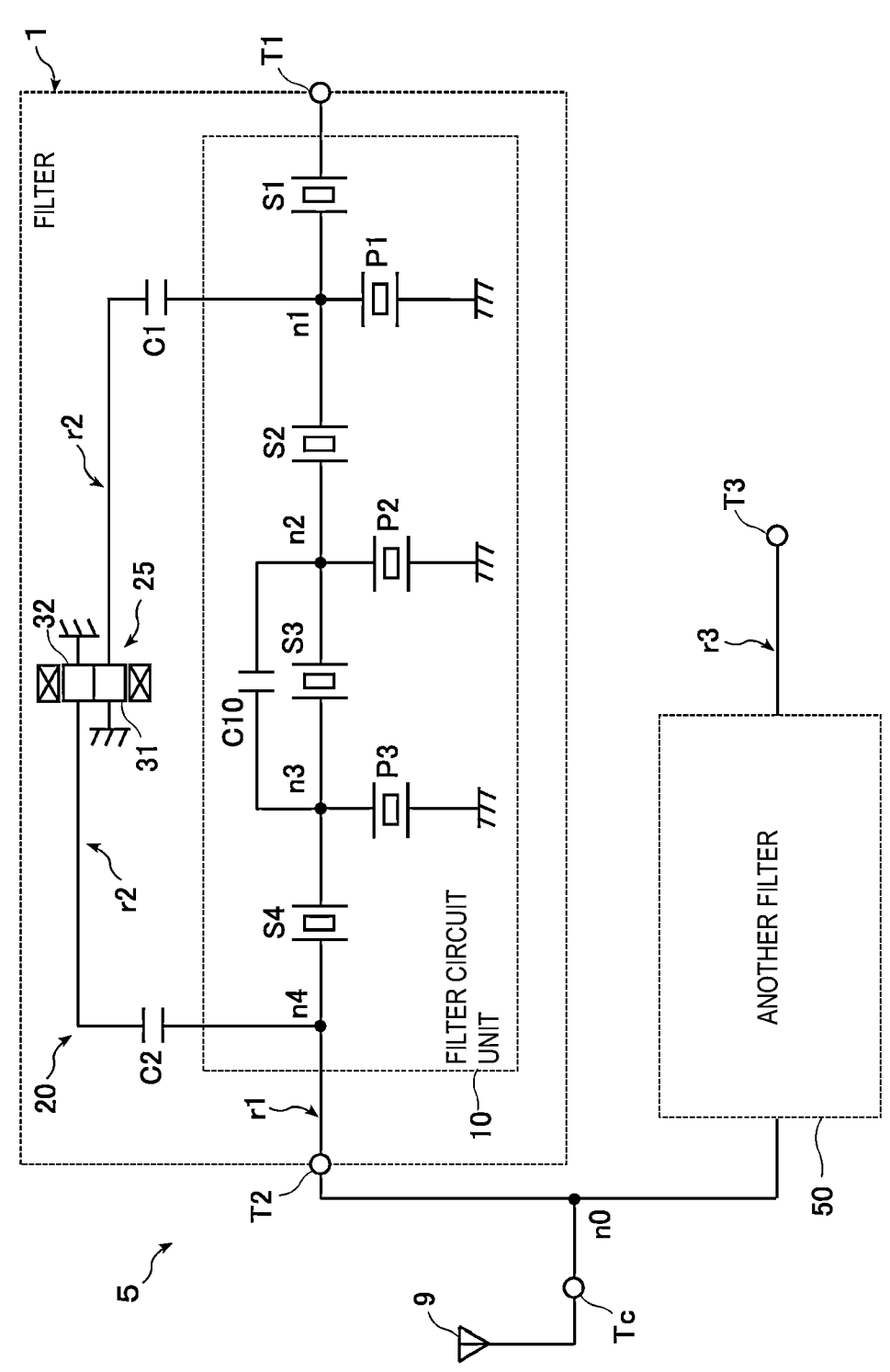
FIG. 1 is a circuit configuration diagram of a multiplexer including a filter according to a preferred embodiment of the present invention.

Hereinafter, preferred embodiments of the present invention will be described in detail using the preferred embodiments and the drawings. Each of the preferred embodiments described below illustrates a general or specific example. Numerical values, shapes, materials, components, disposition, and connection configurations of the components, and the like illustrated in the following preferred embodiments are mere examples, and are not intended to limit the scope of the present invention. Among the components in the following preferred embodiments, components not recited in the independent claims are described as optional components. In addition, sizes or ratios of sizes of components illustrated in the drawings are not necessarily strict. In addition, in the drawings, the same or substantially the same components are denoted by the same reference numerals, and redundant description thereof may be omitted or simplified. In addition, in the following preferred embodiments, "connected" includes not only a case of direct connection but also a case of electrical connection via another element or the like.

Preferred Embodiments

Configuration of Multiplexer

A configuration of a multiplexer including a filter according to a preferred embodiment will be described with reference to FIG. 1.

FIG. 1 is a circuit configuration diagram of a multiplexer 5 including a filter 1 according to the present preferred embodiment. An antenna element 9 is also illustrated in FIG. 1.

The multiplexer 5 is, for example, a splitter or a combiner including a plurality of filters having different pass bands. As illustrated in FIG. 1, the multiplexer 5 includes the filter 1 including a filter circuit 10 and an additional circuit 20, and another filter 50. In addition, the multiplexer 5 includes a first signal terminal T1, a second signal terminal T2, a third signal terminal T3, and a common terminal Tc.

The first signal terminal T1 is provided on one input/output side of the filter 1. The first signal terminal T1 is connected to an RF signal processing circuit (not illustrated) via an amplifier circuit or the like (not illustrated) provided outside the multiplexer 5.

The second signal terminal T2 is provided on another input/output side of the filter 1. The second signal terminal T2 is connected to the common terminal Tc.

The common terminal Tc is connected to each of the filter 1 and the other filter 50. Specifically, the common terminal Tc is connected to the filter 1 via a node n0 that is a connection node between the filter 1 and the other filter 50 and is connected to the other filter 50 via the node n0. Further, the common terminal Tc is connected to the antenna element 9 provided outside the multiplexer 5. The common terminal Tc is also an antenna terminal of the multiplexer 5. A node is where a path branches into separate paths.

The third signal terminal T3 is different from the first signal terminal T1, the second signal terminal T2, and the common terminal Tc. The third signal terminal T3 is connected to the other filter 50. Further, the third signal terminal T3 is connected to an RF signal processing circuit (not illustrated) via an amplifier circuit or the like (not illustrated) provided outside the multiplexer 5.

The filter 1 is disposed on a first path r1 connecting the first signal terminal T1 and the second signal terminal T2. The filter 1 is, for example, a transmission filter having an uplink frequency band (transmission band) as a pass band and is set to have the pass band lower than that of the other filter 50. The filter 1 includes the filter circuit 10 and the additional circuit 20 additionally connected to the filter circuit 10. The additional circuit 20 is to cancel an unnecessary wave generated in the pass band of the other filter 50 outside a pass band of the filter circuit 10 (for example, an attenuation band). The additional circuit 20 will be described later.

The other filter 50 is disposed on a third path r3 connecting the common terminal Tc and the third signal terminal T3. The other filter 50 has the pass band different from the pass band of the filter circuit 10. The other filter 50 is, for example, a reception filter having a downlink frequency band (reception band) as the pass band.

Each of the filter 1 and the other filter 50 is required to have characteristics of allowing a predetermined frequency band to pass therethrough, and attenuating a band outside the predetermined frequency band.

Configuration of Filter

A configuration of the filter 1 will be described with reference to FIG. 1 and FIG. 2.

As illustrated in FIG. 1, the filter 1 includes the filter circuit 10 and the additional circuit 20.

The filter circuit 10 includes series-arm resonators S1, S2, S3 and S4 and parallel-arm resonators P1, P2 and P3, which are acoustic wave resonators. Each of the series-arm resonators S1 to S4 and the parallel-arm resonators P1 to P3 includes, for example, an interdigital transducer (IDT) electrode provided on a substrate. The IDT electrode of each of the series-arm resonators S1 and S4 and the parallel-arm resonators P1 and P3 is an example of an electrode of a resonator to be described later.

The series-arm resonators S1 to S4 are disposed on the first path r1 connecting the first signal terminal T1 and the second signal terminal T2. The series-arm resonators S1 to S4 are connected in series in this order, as viewed from the first signal terminal T1 to the second signal terminal T2.

The parallel-arm resonators P1 to P3 are connected to respective paths connecting nodes n1, n2, and n3 and respective ground electrodes, where the series-arm resonators S1 to S4 and the nodes n1, n2, and n3 are alternately adjacent to each other on the first path r1. Specifically, among the parallel-arm resonators P1 to P3, the parallel-arm resonator P1 closest to the first signal terminal T1 includes one end connected to the node n1 between the series-arm resonators S1 and S2 and, another end connected to the ground electrode. The parallel-arm resonator P2 includes one end connected to the node n2 between the series-arm resonators S2 and S3, and another end connected to the ground electrode. The parallel-arm resonator P3 includes one end connected to the node n3 between the series-arm resonators S3 and S4, and another end connected to the ground electrode. A bridging capacitance element C10 is connected in parallel with the series-arm resonator S3. The parallel-arm resonators P1 to P3 may be connected to a path connecting a ground electrode and a node between the first signal terminal T1 and the series-arm resonator S1, or to a line connecting a ground electrode and a node between the second signal terminal T2 and the series-arm resonator S4.

As described above, the filter circuit 10 has a T-shaped ladder filter structure including the four series-arm resonators S1 to S4 disposed on the first path r1, and the three parallel-arm resonators P1 to P3 disposed on the respective paths connecting the first path r1 and the respective ground electrodes.

The number of series-arm resonators of the filter circuit 10 and the number of parallel-arm resonators are not limited to three or four, and it is sufficient that the number of series-arm resonators is equal to or greater than two, and the number of parallel-arm resonators is equal to or greater than one. Further, the parallel-arm resonator may be connected to the ground electrode via an inductor.

Next, the additional circuit 20 of the filter 1 will be described. The additional circuit 20 applies a phase opposite to that of an unnecessary wave outside the pass band generated in the filter circuit 10 to prevent the unnecessary wave from being outputted from the filter 1. That is, the additional circuit 20 applies a signal having a phase opposite to that of an unnecessary wave which is a signal in an attenuation band to cancel an unnecessary wave component and improve attenuation in the attenuation band. The signal having an opposite phase is provided by connecting the acoustically coupled resonator 25 in parallel with the filter circuit 10. In this example, a signal phase obtained in a second path r2 close to an IDT 32 is opposite to a signal phase obtained in the second path r2 close to an IDT 31 of the acoustically coupled resonator 25, and thus a signal having an opposite phase is applied to the filter circuit 10 by connecting the acoustically coupled resonator 25 in parallel with the filter circuit 10. Accordingly, an unnecessary wave component in the attenuation band is canceled, and the attenuation in the attenuation band is improved.

The additional circuit 20 is connected to a plurality of different nodes, that is, the node n1 and a node n4, on the first path r1 so as to be connected in parallel with at least a portion of the first path r1. The node n4 is a connection node located between the series-arm resonator S4 and the second signal terminal T2. The additional circuit 20 is provided on a path of the first path r1 to bypass an interval between the node n1 and the node n4, that is, on the second path r2 connecting the node n1 and the node n4. The additional circuit 20 includes the acoustically coupled resonator 25 disposed on the second path r2, and a plurality of capacitance elements C1 and C2.

The acoustically coupled resonator 25 is electrically connected to the node n1 via the capacitance element C1 and is also electrically connected to the node n4 via the capacitance element C2. The node n1 and the node n4 are acoustically connected to each other via the acoustically coupled resonator 25 on the second path r2. For example, each of the capacitance elements C1 and C2 and the bridging capacitance element C10 may be a capacitance of a horizontal IDT (IDT in which an extending direction of an IDT electrode is different from an extending direction of an IDT electrode of a filter resonator by about 90°). Further, each of the capacitance elements C1 and C2 and the bridging capacitance element C10 may be a capacitance in which a dielectric film is sandwiched between metal films.

Figure 2:
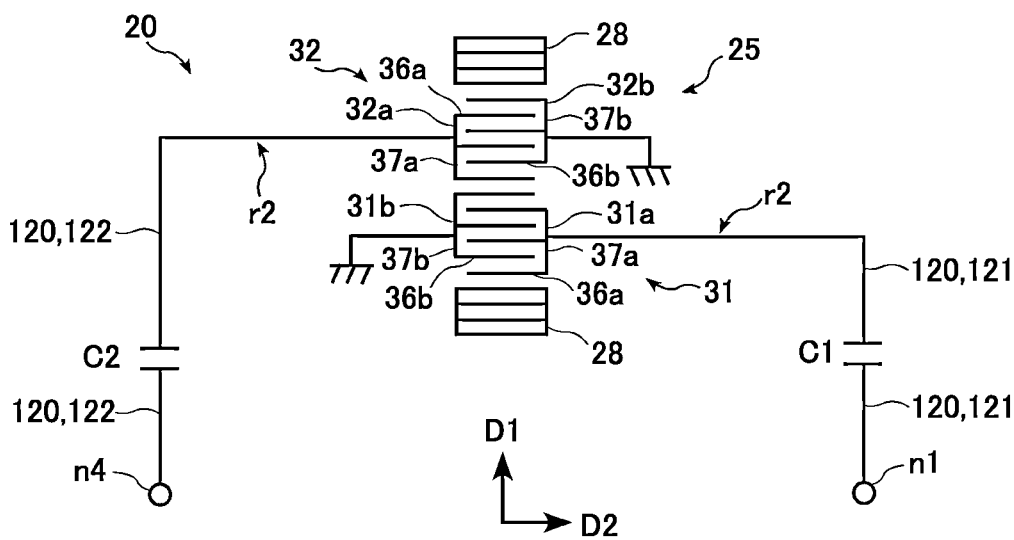
FIG. 2 is a schematic diagram illustrating an acoustically coupled resonator included in an additional circuit of a filter according to a preferred embodiment of the present invention.

FIG. 2 is a schematic diagram illustrating the acoustically coupled resonator 25 included in the additional circuit 20 of the filter 1. In FIG. 2, electrodes and wiring lines are indicated by solid lines. A plurality of reflectors 28 are also illustrated in FIG. 2. The plurality of reflectors 28 are disposed on respective outer sides of the acoustically coupled resonator 25, so as to sandwich the acoustically coupled resonator 25 in an acoustic wave propagation direction D1.

The acoustically coupled resonator 25 is a resonator including a plurality of acoustic wave resonators adjacent to each other. The acoustically coupled resonator 25 illustrated in FIG. 2 is, for example, a longitudinally coupled acoustic wave resonator, and is configured with a plurality of the IDT electrodes 31 and 32. The acoustic wave resonator may be, for example, a surface acoustic wave (SAW) resonator or a bulk acoustic wave (BAW) resonator. Acoustic coupling may be, for example, of a longitudinal coupling type, of a lateral coupling type or of a transversal type.

The plurality of IDT electrodes 31 and 32 are disposed such that the IDT electrodes are adjacent to each other along the acoustic wave propagation direction D1. The plurality of IDT electrodes include one comb-shaped electrodes and another comb-shaped electrodes. Of the plurality of IDT electrodes 31 and 32, the IDT electrode 31, which is first, includes one comb-shaped electrode 31a and another comb-shaped electrode 31b facing each other. The IDT electrode 32, which is second, includes one comb-shaped electrode 32a and another comb-shaped electrode 32b facing each other. When the IDT electrodes 31 and 32 are viewed from a direction perpendicular or substantially perpendicular to a substrate 100 (see FIG. 3), the one comb-shaped electrode 31a and the other comb-shaped electrode 32b face the same direction and are disposed side by side along the acoustic wave propagation direction D1. In addition, the other comb-shaped electrode 31b and the one comb-shaped electrode 32a face the same direction and are disposed side by side along the acoustic wave propagation direction D1.

Structure of Acoustically Coupled Resonator of Additional Circuit

A structure of the acoustically coupled resonator 25 of the additional circuit 20 will be described with reference to FIG. 3.

Figure 3:
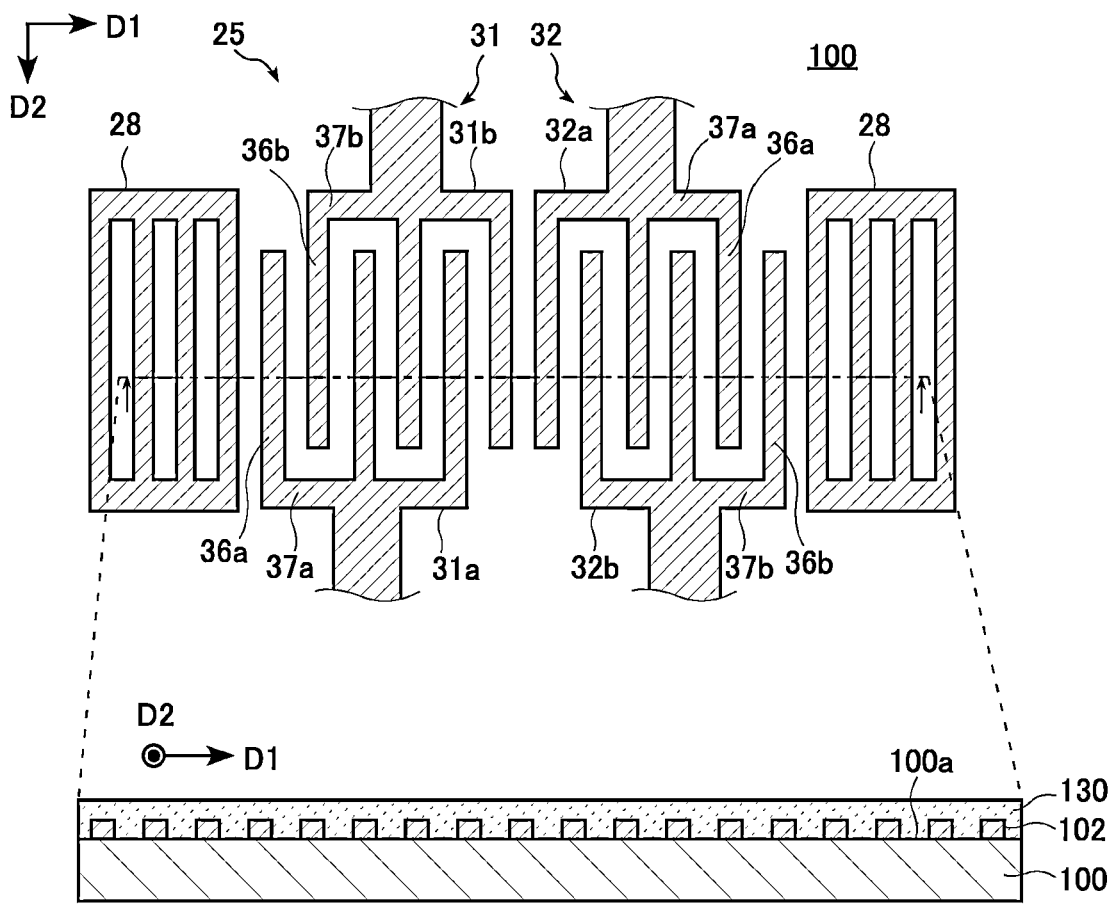
FIG. 3 is a plan view and a cross-sectional view schematically illustrating a structure of the acoustically coupled resonator illustrated in FIG. 2.

FIG. 3 is a plan view and a cross-sectional view schematically illustrating the structure of the acoustically coupled resonator 25. Two among the reflectors 28 are also illustrated in FIG. 3. The acoustically coupled resonator 25 illustrated in FIG. 3 is intended to explain a typical structure of a resonator, and lengths and the number of electrode fingers included in an IDT electrode and the reflectors are not limited thereto.

The acoustically coupled resonator 25 includes the substrate 100 having piezoelectricity, an electrode layer 102 including the plurality of IDT electrodes 31 and 32 provided on the substrate 100, and an insulating film 130 provided on the substrate 100 so as to cover both of the IDT electrodes 31 and 32.

The substrate 100 is, for example, a lithium niobate substrate (LiNbO$_3$ substrate) having a cut-angle of about 127.5°. When a Rayleigh wave is used as an acoustic wave propagating in the substrate 100, the cut-angle of the substrate 100 is preferably, for example, about 120°±20° or about 300°±20°. The substrate 100 may be a piezoelectric substrate in which the substrate as a whole is made of the above-described piezoelectric material. In other words, the substrate 100 may be a substrate defined by a single piezoelectric layer. In addition, a laminated substrate may be used in which a piezoelectric layer formed of the above-described piezoelectric material is laminated on a support substrate. A dielectric film may be further provided between the piezoelectric layer and the support substrate. An effective relative dielectric constant of the piezoelectric layer is, for example, about 55.

The electrode layer 102 is made of one metal film or a plurality of metal films. A metal film such as a wiring line connected to the acoustically coupled resonator 25 will be described later.

The insulating film 130 is, for example, a dielectric film including silicon dioxide (SiO₂) as a main component. In this specification, the main component means a component that accounts for more than 50% by weight. The insulating film 130 is provided for the purpose of adjusting frequency-temperature characteristics of the acoustically coupled resonator 25, protecting the electrode layer 102 from an external environment, improving moisture resistance, or the like. Further, the insulating film 130 is provided at a position different from a position illustrated in FIG. 3 for the purpose of reducing a signal leakage path generated between wiring of the filter circuit 10 and wiring of the additional circuit 20. This will be described later.

As illustrated in the plan view of FIG. 3, the IDT electrode 31 includes the one comb-shaped electrode 31a and the other comb-shaped electrode 31b facing each other. The IDT electrode 32 includes the one comb-shaped electrode 32a and the other comb-shaped electrode 32b facing each other.

Each of the one comb-shaped electrodes 31a and 32a has a comb shape and includes a plurality of electrode fingers 36a parallel or substantially parallel to each other and a busbar 37a that connects respective one ends of the plurality of electrode fingers 36a to each other. Each of the other comb-shaped electrodes 31b and 32b has a comb shape and includes a plurality of electrode fingers 36b parallel or substantially parallel to each other and a busbar 37b that connects respective one ends of the plurality of electrode fingers 36b to each other. Each of the busbars 37a and 37b extends along the acoustic wave propagation direction D1. The plurality of electrode fingers 36a and the plurality of electrode fingers 36b extend in an orthogonal or substantially orthogonal direction D2 of the acoustic wave propagation direction D1, are interdigitated with each other in the orthogonal or substantially orthogonal direction D2, and face each other in the acoustic wave propagation direction D1.

As illustrated in FIG. 2, the one comb-shaped electrodes 31a and 32a are electrically connected to the nodes n1 and n4, which are a plurality of different nodes on the first path r1, respectively. To be more specific, the one comb-shaped electrode 31a is connected to the node n1 via the second path r2 on one side, and the one comb-shaped electrode 32a is connected to the node n4 via the second path r2 on another side. The other comb-shaped electrodes 31b and 32b are electrically connected to respective predetermined ground electrodes.

It is sufficient that the one comb-shaped electrodes 31a and 32a are connected to respective nodes on both outer sides of two or more series-arm resonators adjacent to each other on the first path r1. For example, the one comb-shaped electrode 31a may be connected to a node on the first path r1 connecting the first signal terminal T1 and the series-arm resonators S1, or may be connected to the node n2. For example, the one comb-shaped electrode 32a may be connected to the node n3.

Wiring Structure of Filter

A wiring structure of the filter 1 will be described with reference to FIG. 4A to FIG. 9.

Figure 4A:
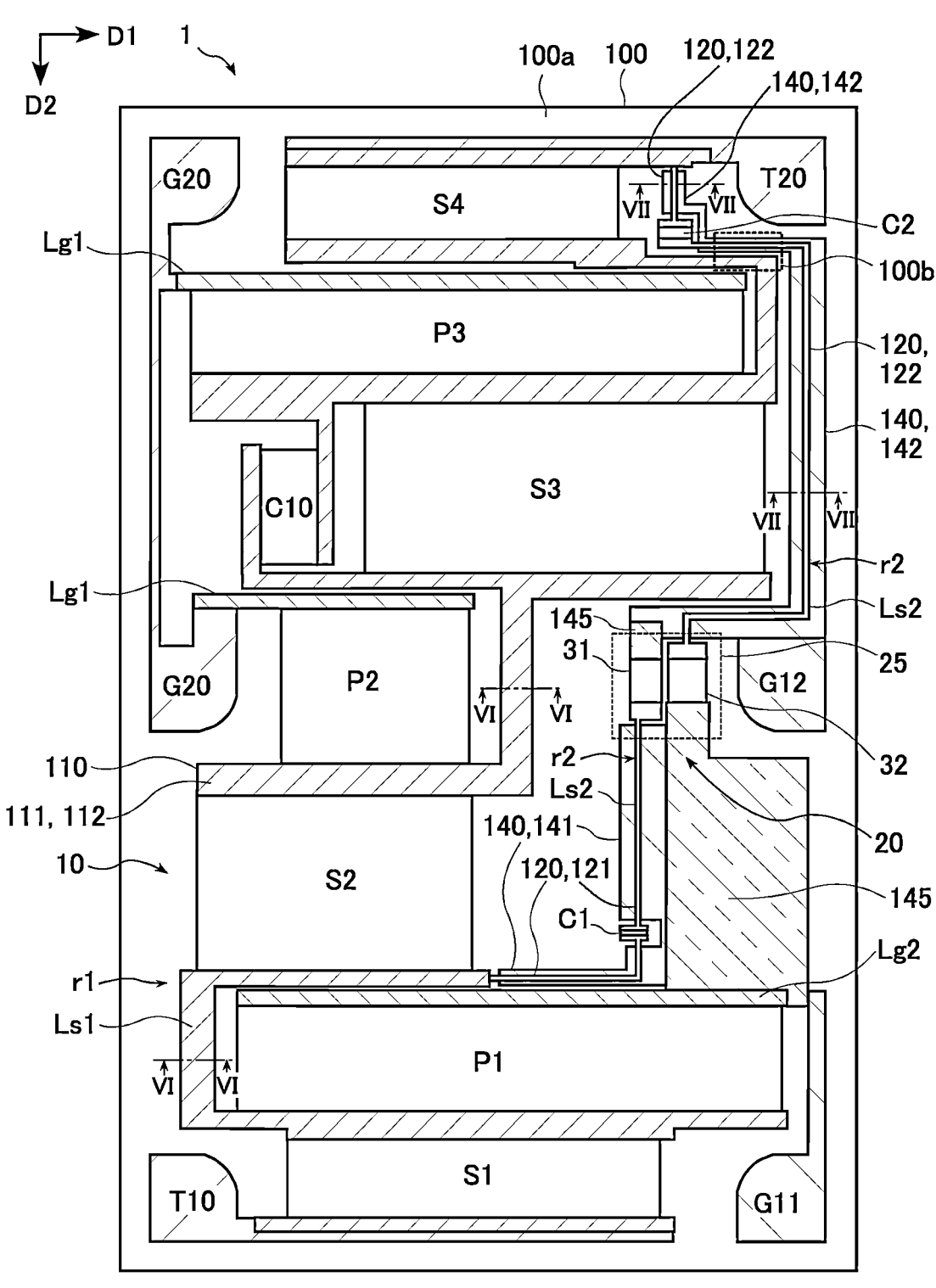
FIG. 4A is a plan view of a filter according to a preferred embodiment of the present invention.
Figure 4B:
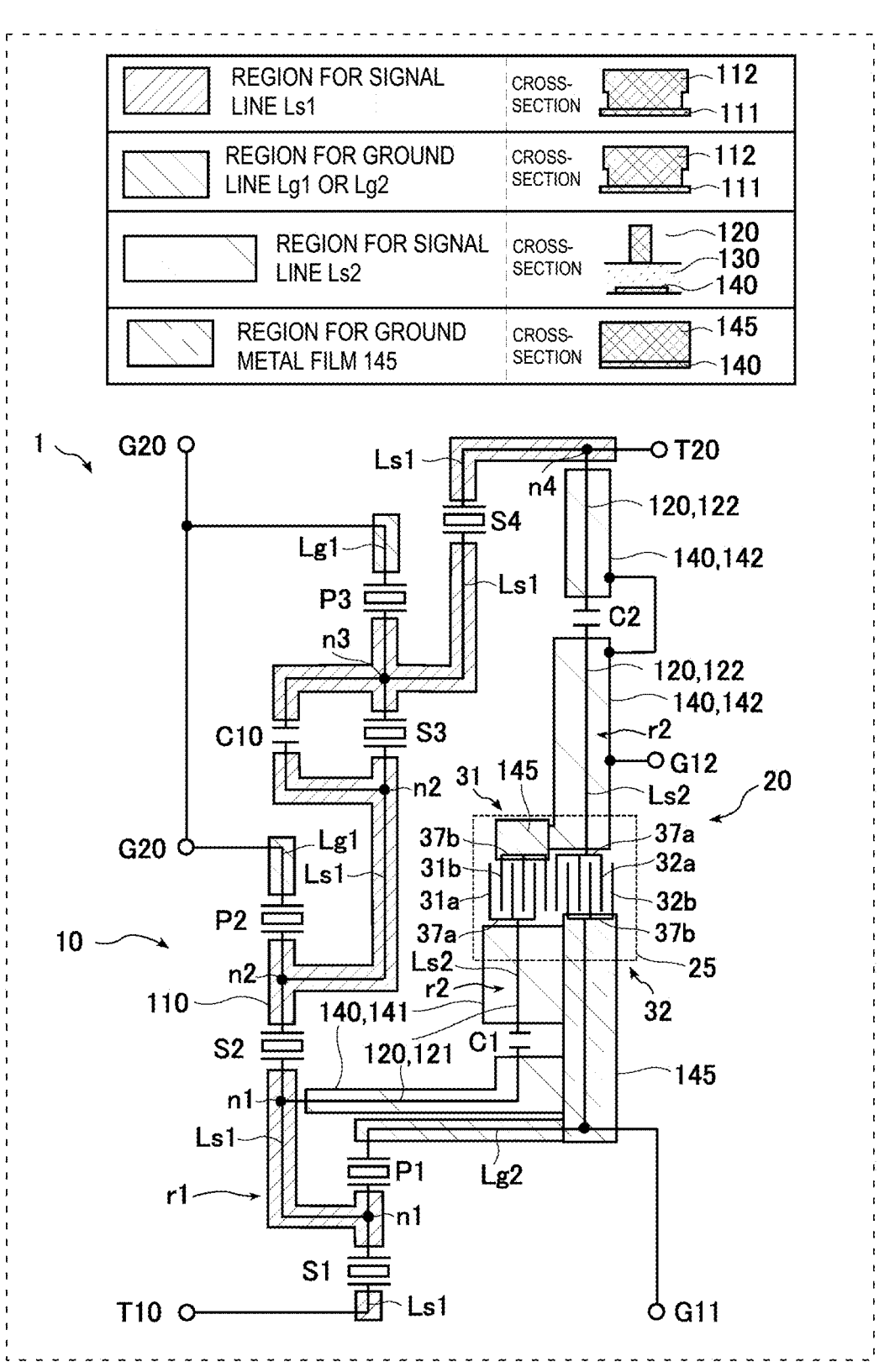
FIG. 4B is a diagram schematically illustrating wiring of a filter according to a preferred embodiment of the present invention.
Figure 5:
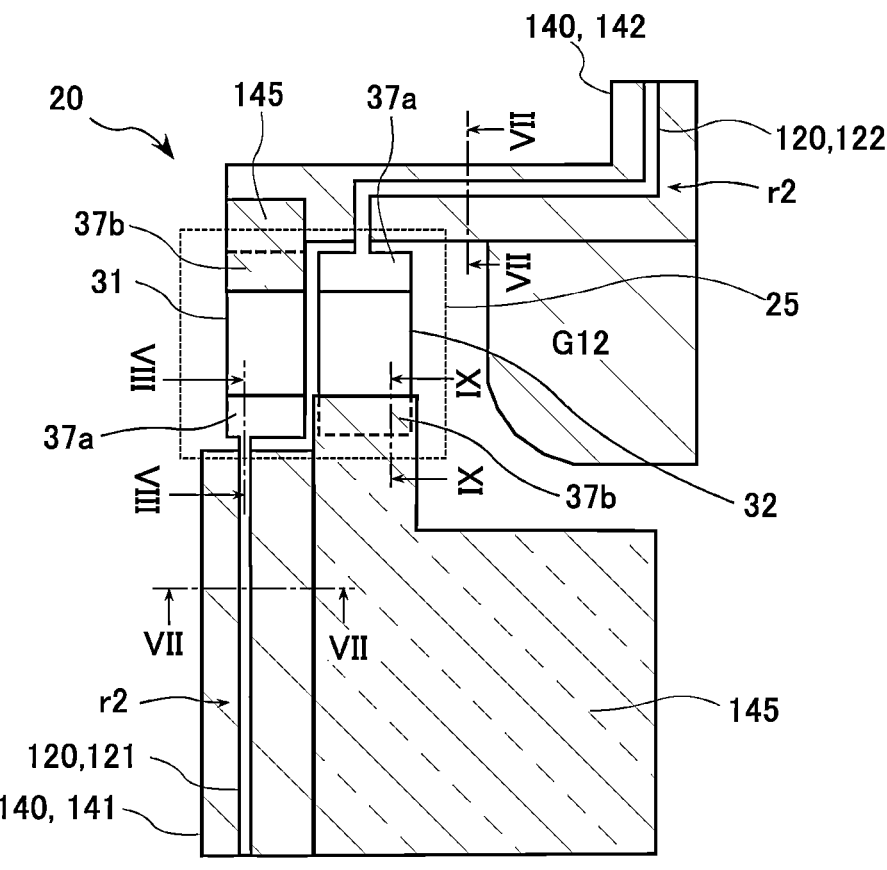
FIG. 5 is an enlarged view of a portion of an additional circuit of a filter according to a preferred embodiment of the present invention.

FIG. 4A is a plan view of the filter 1 according to the present preferred embodiment. FIG. 4B is a diagram schematically illustrating wiring of the filter 1. FIG. 5 is an enlarged view of a portion of the additional circuit 20 of the filter 1. FIG. 4B illustrates a structure in a vicinity of the wiring, and does not illustrate a detailed structure between adjacent wiring lines. In addition, in the following drawings including these drawings, illustration of the reflector 28 is omitted.

As illustrated in FIGS. 4A and 4B, the filter 1 includes the filter circuit 10 and the additional circuit 20. Further, the filter 1 includes a first signal electrode T10 and a second signal electrode T20 to and from which signals are inputted and outputted, a first ground electrode G11, a second ground electrode G12 and another ground electrode G20. The first signal electrode T10 is electrically connected to the first signal terminal T1 described above, and the second signal electrode T20 is electrically connected to the second signal terminal T2 described above.

The first ground electrode G11 and the second ground electrode G12 are separated from each other and disposed on the substrate 100, and are not electrically connected to each other. Further, the first ground electrode G11 and the second ground electrode G12 are not electrically connected to the other ground electrode G20.

The filter circuit 10 includes one or more resonators provided on the substrate 100, and a main wiring line 110 provided on the substrate 100.

The one or more resonators include the series-arm resonators S1 to S4 and the parallel-arm resonators P1 to P3 described above. An electrode of each resonator is defined by a portion of a first metal film described later.

The main wiring line 110 is connected to each resonator. The main wiring line 110 includes a signal line Ls1 to transmit a high-frequency signal, a ground line Lg1 connected to the other ground electrode G20, and a ground line Lg2 connected to the first ground electrode G11.

The signal line Ls1 is a wiring line provided between the first signal electrode T10 and the series-arm resonator S1, between the series-arm resonators S1 and S2, between the series-arm resonators S2 and S3, between the series-arm resonators S3 and S4, between the series-arm resonator S4 and the second signal electrode T20, between the node n1 and the parallel-arm resonator P1, between the node n2 and the parallel-arm resonator P2, between the node n3 and the parallel-arm resonator P3, and between the bridging capacitance element C10 and the nodes n2 and n3. The ground line Lg1 is a wiring line provided between the parallel-arm resonator P2 and the other ground electrode G20, and between the parallel-arm resonator P3 and the other ground electrode G20. The ground line Lg2 is a wiring line present between the parallel-arm resonator P1 and the first ground electrode G11.

Figure 6:
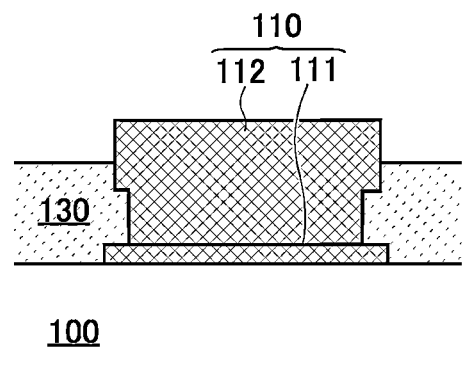
FIG. 6 is a cross-sectional view of a main wiring line of a filter according to a preferred embodiment of the present invention when viewed along line VI-VI illustrated in FIG. 4A.

FIG. 6 is a cross-sectional view of the main wiring line 110 of the filter 1 when viewed along line VI-VI illustrated in FIG. 4A. In FIG. 6, a thickness of the substrate 100 is illustrated to be thinner than an actual thickness. The same applies to the following cross-sectional views.

As illustrated in FIG. 6, the main wiring line 110 includes a lower layer metal film 111 provided on the substrate 100, and a main wiring metal film 112 provided on the lower layer metal film 111. The lower layer metal film 111 is in contact with the substrate 100, and the main wiring metal film 112 is in contact with the lower layer metal film 111. That is, the main wiring line 110 is a multilayer film in which the main wiring metal film 112 is laminated on the lower layer metal film 111. The lower layer metal film 111 includes a portion of the first metal film described later, and the main wiring metal film 112 includes a portion of a second metal film described later.

As illustrated in FIGS. 4A and 4B, the additional circuit 20 includes the acoustically coupled resonator 25 provided on the substrate 100, a sub-wiring line 120 and a ground wiring line 140 provided on the substrate 100, and the plurality of capacitance elements C1 and C2 provided on substrate 100.

The plurality of capacitance elements C1 and C2 are provided on the second path r2 connecting the acoustically coupled resonator 25 and the filter circuit 10. Of the plurality of capacitance elements C1 and C2, the capacitance element C1 on one side is provided on the second path r2 connecting the filter circuit 10 and the first IDT electrode 31. The capacitance element C2 on another side different from the capacitance element C1 on the one side is provided on the second path r2 connecting the filter circuit 10 and the second IDT electrode 32.

The sub-wiring line 120 connects the acoustically coupled resonator 25 and the filter circuit 10. The sub-wiring line 120 includes a first sub-wiring line 121 and a second sub-wiring line 122 provided on the substrate 100. The first sub-wiring line 121 electrically connects the acoustically coupled resonator 25 to the node n1, and the second sub-wiring line 122 electrically connects the acoustically coupled resonator 25 to the node n4.

The ground wiring line 140 is provided to reduce or prevent a signal leakage path generated between the main wiring line 110 and the sub-wiring line 120. The ground wiring line 140 includes a first ground wiring line 141 and a second ground wiring line 142. The first ground wiring line 141 is connected to the first ground electrode G11. The second ground wiring line 142 is connected to the second ground electrode G12. The ground wiring line 140 is not connected to the main wiring line 110 and the sub-wiring line 120 which are signal lines.

The acoustically coupled resonator 25 includes the first IDT electrode 31 to and from which signals are inputted and outputted and the second IDT electrode 32 to and from which signals are reversely inputted and outputted as compared with the first IDT electrode 31.

The one comb-shaped electrodes 31a and 32a among the plurality of comb-shaped electrodes are connected to the sub-wiring line 120. To be specific, the comb-shaped electrode 31a of the first IDT electrode 31 is connected to the node n1 via the first sub-wiring line 121. The comb-shaped electrode 32a of the second IDT electrode 32 is connected to the node n4 via the second sub-wiring line 122.

The other comb-shaped electrodes 31b and 32b among the plurality of comb-shaped electrodes are connected to the ground wiring line 140. To be specific, the comb-shaped electrode 31b of the first IDT electrode 31 is connected to the first ground electrode G11 via the first ground wiring line 141. The comb-shaped electrode 32b of the second IDT electrode 32 is connected to the second ground electrode G12 via the second ground wiring line 142.

Figure 7:
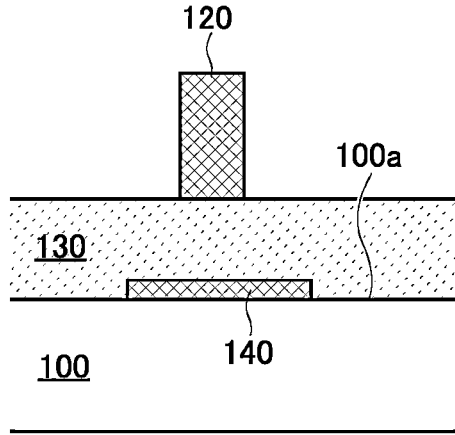
FIG. 7 is a cross-sectional view of a sub-wiring line and a ground wiring line of the additional circuit of a preferred embodiment when viewed along line VII-VII illustrated in FIG. 4A and FIG. 5.

FIG. 7 is a cross-sectional view of the sub-wiring line 120 and the ground wiring line 140 of the additional circuit 20 when viewed along line VII-VII illustrated in FIG. 4A and FIG. 5. The sub-wiring line 120 and the ground wiring line 140 illustrated in FIG. 7 extend in a direction perpendicular or substantially perpendicular to a paper surface of FIG. 7. The sub-wiring line 120 includes a portion of the second metal film described later, and the ground wiring line 140 includes a portion of the first metal film described later.

As illustrated in FIG. 7, the ground wiring line 140, the insulating film 130 and the sub-wiring line 120 are provided on the substrate 100. Specifically, the ground wiring line 140 is provided on the substrate 100, the insulating film 130 is provided on the ground wiring line 140, and the sub-wiring line 120 is provided on the insulating film 130. That is, when a plane perpendicular or substantially perpendicular to a direction in which the wiring lines extend is viewed, the insulating film 130 is provided between the substrate 100 and the sub-wiring line 120, and the ground wiring line 140 is provided between the substrate 100 and the insulating film 130.

The insulating film 130 is made of, for example, the material including silicon dioxide as described above. A thickness of the insulating film 130 is, for example, equal to or greater than about 1000 nm and equal to or less than about 3000 nm. As for a relative dielectric constant $\varepsilon_r$ of the insulating film 130, for example, $\varepsilon_r$=about 3.8, which is smaller than a relative dielectric constant $\varepsilon_r$=about 55 of the piezoelectric layer included in the substrate 100. The relative dielectric constant $\varepsilon_r$ of the insulating film 130 is, for example, from about 0.02 to about 0.2 times the relative dielectric constant of the piezoelectric layer. By providing the insulating film 130 having a small relative dielectric constant between the sub-wiring line 120 and the ground wiring line 140, capacitive coupling between the main wiring line 110 and the sub-wiring line 120 via the substrate 100 can be reduced or prevented, and the signal leakage path generated between the main wiring line 110 and the sub-wiring line 120 can be reduced or prevented.

The ground wiring line 140 is provided on the substrate 100 in a state of being in contact with the substrate 100. For example, when a dimension in a direction parallel or substantially parallel to a main surface 100a of the substrate 100 and perpendicular or substantially perpendicular to a direction in which the ground wiring line 140 extends is defined as a width, a width of the ground wiring line 140 is greater than a width of the sub-wiring line 120. Specifically, when viewed from a side of the substrate 100, both ends in a width direction of the ground wiring line 140 are located outside both ends of the sub-wiring line 120, and the ground wiring line 140 is provided so as to cover the sub-wiring line 120. That is, the sub-wiring line 120 of the additional circuit 20 includes a shielded structure covered with the ground wiring line 140 from below. By providing the ground wiring line 140 between the substrate 100 and the sub-wiring line 120 in such a configuration, capacitive coupling between the main wiring line 110 and the sub-wiring line 120 via the substrate 100 can be reduced or prevented, and the signal leakage path generated between the main wiring line 110 and the sub-wiring line 120 can be reduced or prevented.

For example, it is preferable that the sub-wiring line 120 having the above-described shielded structure is provided in a region 100b (see FIG. 4A) on the substrate 100 closest to the main wiring line 110. In FIG. 4A, the sub-wiring line 120 having the above-described shielded structure is provided along the main wiring line 110 connecting the series-arm resonators S3 and S4. Thus, it is preferable that the sub-wiring line 120 located in a vicinity of the main wiring line 110 has the above-described shielded structure.

Figure 8:
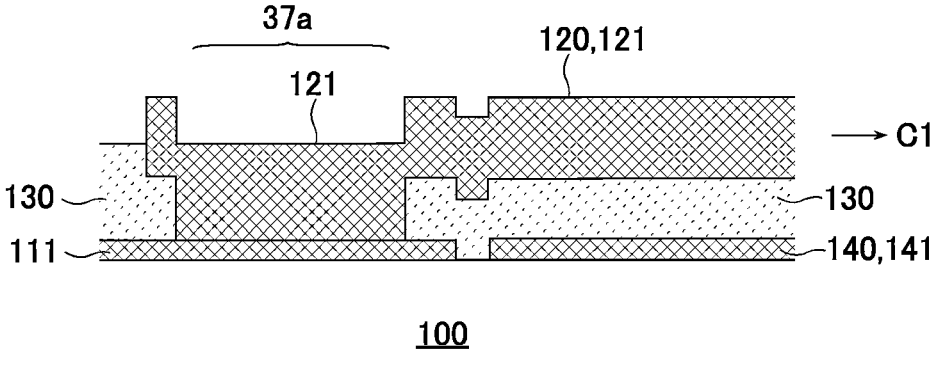
FIG. 8 is a cross-sectional view of a portion of a first IDT electrode, a first sub-wiring line, and a first ground wiring line included in an additional circuit of a preferred embodiment of the present invention when viewed along line VIII-VIII illustrated in FIG. 5.

FIG. 8 is a cross-sectional view of a portion of the first IDT electrode 31, the first sub-wiring line 121, and the first ground wiring line 141 included in the additional circuit 20 when viewed along line VIII-VIII illustrated in FIG. 5. FIG. 8 illustrates the busbar 37*a* of the one comb-shaped electrode 31*a* as a portion of the first IDT electrode 31.

As illustrated in FIG. 8, the busbar 37*a* of the one comb-shaped electrode 31*a* includes the lower layer metal film 111 provided on the substrate 100 and the first sub-wiring line 121 provided on the lower layer metal film 111. The first sub-wiring line 121 extends from the capacitance element C1 toward the busbar 37*a*, and is connected to the lower layer metal film 111 constituting the busbar 37*a*. The insulating film 130 and the first ground wiring line 141 are disposed below the first sub-wiring line 121 extending from the capacitance element C1 to the busbar 37*a*. The first ground wiring line 141 is provided between the substrate 100, and the insulating film 130 is located between the substrate 100 and the first sub-wiring line 121. The first ground wiring line 141 is disposed up to a vicinity of the busbar 37*a* so as to shield the first sub-wiring line 121 when viewed from the substrate 100.

Similarly, the second ground wiring line 142 is provided between the substrate 100, and the insulating film 130 located between the substrate 100 and the second sub-wiring line 122 (not illustrated). The second ground wiring line 142 is disposed up to a vicinity of the busbar 37*a* of the one comb-shaped electrode 32*a* of the second IDT electrode 32 so as to shield the second sub-wiring line 122 when viewed from the substrate 100.

Figure 9:
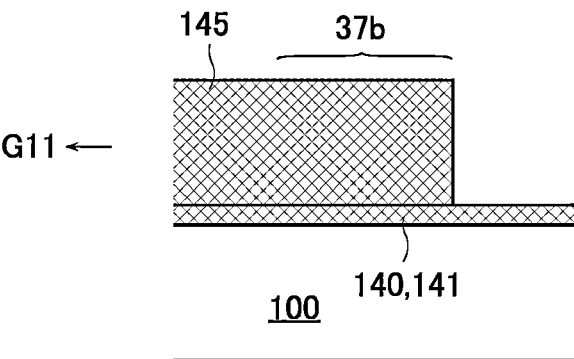
FIG. 9 is a cross-sectional view of a second IDT electrode included in an additional circuit of a preferred embodiment of the present invention when viewed along line IX-IX illustrated in FIG. 5.

FIG. 9 is a cross-sectional view of a portion of the second IDT electrode 32 and the first ground wiring line 141 included in the additional circuit 20 when viewed along line IX-IX illustrated in FIG. 5. FIG. 9 illustrates the busbar 37*b* of the other comb-shaped electrode 32*b* as a portion of the second IDT electrode 32.

As illustrated in FIG. 9, the busbar 37*b* of the other comb-shaped electrode 32*b* includes the first ground wiring line 141 provided on the substrate 100, and a ground metal film 145 laminated and provided on the first ground wiring line 141. Further, a wiring line connected to the first ground electrode G11 also includes the first ground wiring line 141 and the ground metal film 145 laminated and provided on the first ground wiring line 141. The ground metal film 145 includes a portion of the second metal film to be described later.

Here, the wiring structure of the filter 1 will be described in an organized manner with reference to FIG. 4B. The signal line Ls1 present in a diagonally upward and rightward hatched region illustrated in FIG. 4B includes the lower layer metal film 111 and the main wiring metal film 112. Each of the ground lines Lg1 and Lg2 in a diagonally downward and rightward hatched region also includes the lower layer metal film 111 and the main wiring metal film 112. The signal line Ls2 illustrated in a wide hatched region includes the sub-wiring line 120. The insulating film 130 is provided below the sub-wiring line 120 (that is, close to the substrate 100). Further, the ground wiring line 140 is provided below the insulating film 130 (that is, close to the substrate 100). The ground wiring line 140 is connected to a predetermined ground electrode.

As described above, in the filter 1 of the present preferred embodiment, the insulating film 130 is provided between the substrate 100 and the sub-wiring line 120. According to this configuration, capacitive coupling between the main wiring line 110 of the filter circuit 10 and the sub-wiring line 120 of the additional circuit 20 via the substrate 100 can be reduced or prevented, and generation of a signal leakage path between the wiring lines can be reduced or prevented. Thus, attenuation outside the pass band of the filter 1 can be ensured.

Method of Manufacturing Wiring Lines and the Like

Next, a non-limiting example of a method of manufacturing wiring lines and the like will be described. A description of a method of manufacturing the busbar of the resonators, the bridging capacitance element C10, the capacitance elements C1 and the C2 is omitted.

First, the lower layer metal film 111 defining the main wiring line 110 of the filter circuit 10, and the ground wiring line 140 of the additional circuit 20 are simultaneously formed on the substrate 100 by, for example, a first photolithography process (Step S11). The lower layer metal film 111 and the ground wiring line 140 are a portion of the first metal film formed in the first photolithography process and are made of the same material and have the same or substantially the same film thickness. The lower layer metal film 111 and the ground wiring line 140 are provided at the same or substantially the same height position on the substrate 100. Each of the lower layer metal film 111 and the ground wiring line 140 is formed by laminating, for example, a NiCr layer, a Pt layer, a Ti layer, and an AlCu layer in order from below and has a total film thickness of, for example, about 330 nm. A portion of the electrode of each acoustic wave resonator and a portion of the IDT electrodes 31 and 32 are also formed of the first metal film at the same time.

Next, the insulating film 130 is formed so as to cover the lower layer metal film 111 and the ground wiring line 140 (step S12). At this time, the electrode of the acoustic wave resonator and the IDT electrodes 31 and 32 are also covered with the insulating film 130.

Next, the insulating film 130 located above the lower layer metal film 111 is removed by, for example, etching or the like (step S13). At this time, the insulating film 130 on the busbar 37*b* of each of the other comb-shaped electrodes 31*b* and 32*b* included in the IDT electrodes 31 and 32, respectively, is also removed. The insulating film 130 located on the ground wiring line 140 is not removed.

Next, the main wiring metal film 112 and the sub-wiring line 120 are simultaneously formed by, for example, a second photolithography process (step S14). Specifically, the main wiring metal film 112 is laminated and formed on the lower layer metal film 111. Further, the sub-wiring line 120 is formed above the ground wiring line 140 with the insulating film 130 interposed therebetween. Further, the ground metal film 145 is laminated and formed on the busbar 37*b* of each of the IDT electrodes 31 and 32.

The main wiring metal film 112, the sub-wiring line 120, and the ground metal film 145 are a portion of the second metal film, and are made of the same material and have the same or substantially the same film thickness. The main wiring metal film 112, the sub-wiring line 120, and the ground metal film 145 are provided at different height positions on the substrate 100. Each of the main wiring metal film 112, the sub-wiring line 120, and the ground metal film 145 is formed by laminating, for example, a Ti layer, an AlCu layer, and a Ti layer in order from below and has a total film thickness of, for example, about 2520 nm.

By these steps S11 to S14, the signal lines Ls1 and Ls2 and the ground lines Lg1 and Lg2 are formed on the substrate 100. The insulating film 130 is formed between the sub-wiring line 120 of the signal line Ls2 and the substrate 100, and the ground wiring line 140 is formed between the insulating film 130 and the substrate 100.

Modification of Preferred Embodiment

A filter 1A according to a modification of a preferred embodiment of the present invention will be described with reference to FIG. 10A to FIG. 12.

Figure 10A:
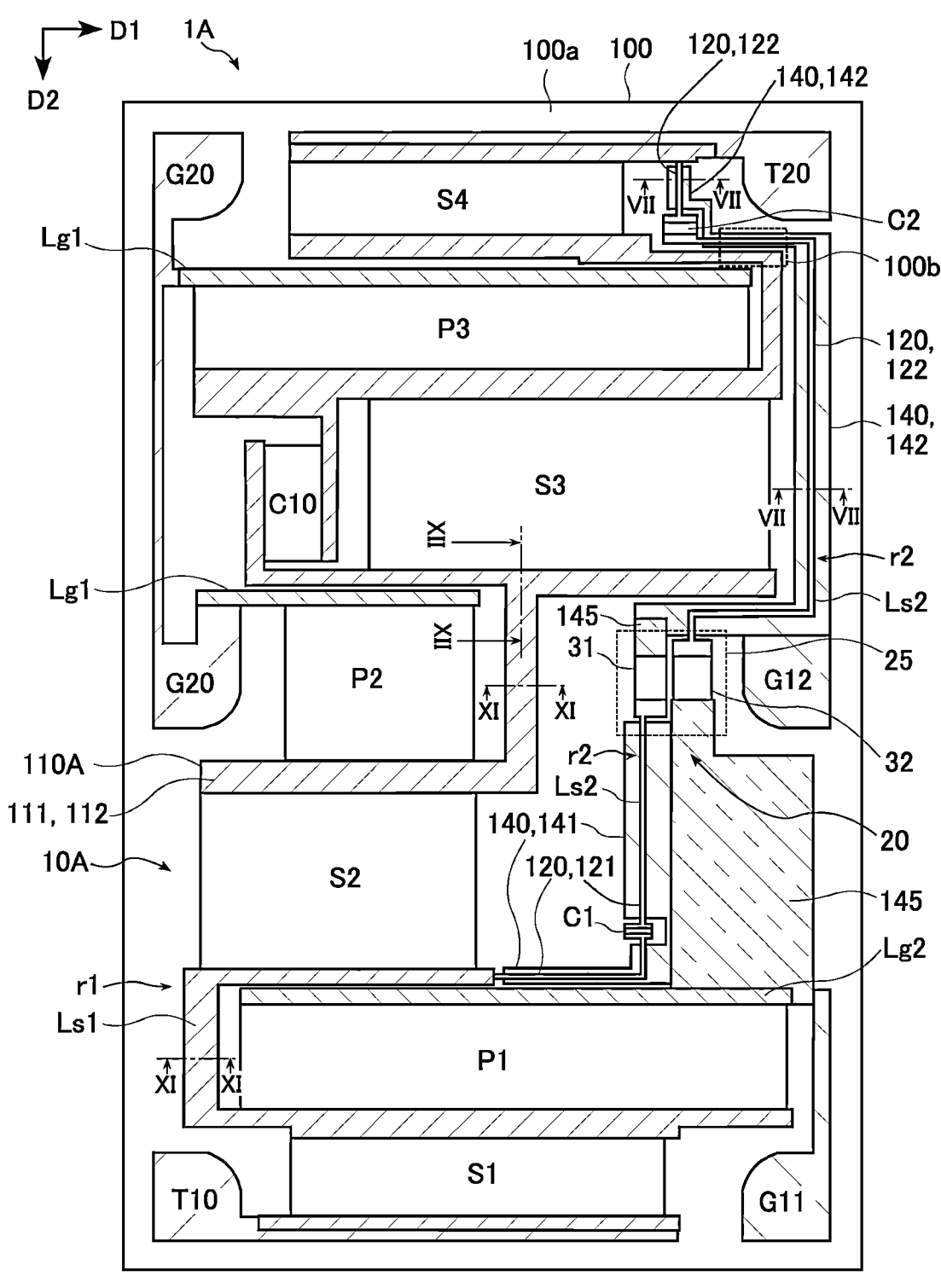
FIG. 10A is a plan view of a filter according to a modification of a preferred embodiment of the present invention.
Figure 10B:
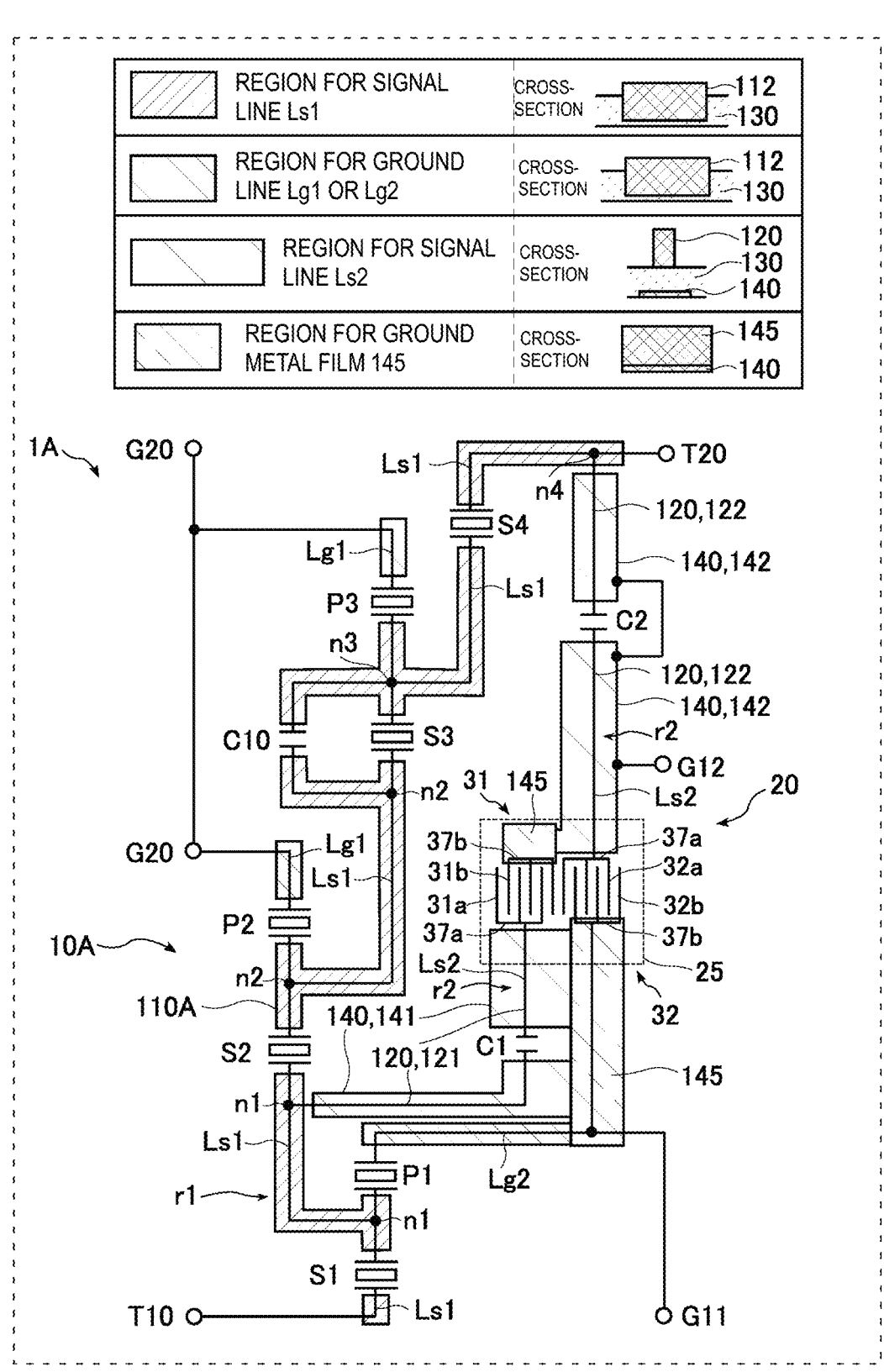
FIG. 10B is a diagram schematically illustrating wiring of the filter according to a modification of a preferred embodiment of the present invention.
Figure 11:
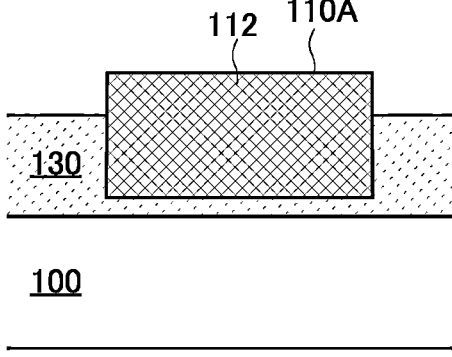
FIG. 11 is a cross-sectional view of a main wiring line of a filter according to a modification of a preferred embodiment of the present invention when viewed along line XI-XI illustrated in FIG. 10A.
Figure 12:
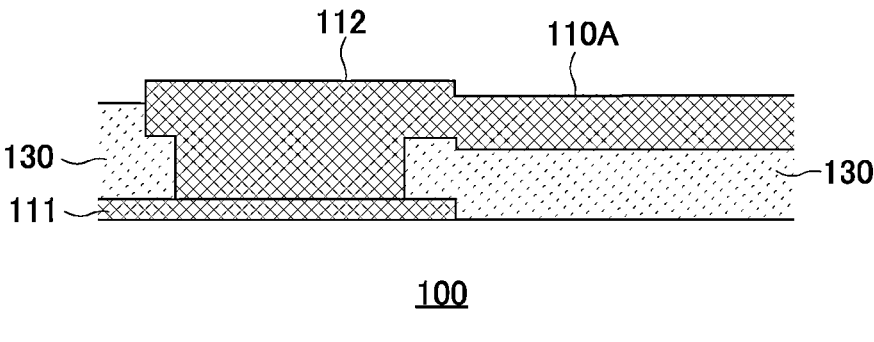
FIG. 12 is a cross-sectional view of a main wiring line of a filter according to a modification of a preferred embodiment of the present invention when viewed along line XII-XII illustrated in FIG. 10A.

FIG. 10A is a plan view of the filter 1A according to the modification. FIG. 10B is a diagram schematically illustrating wiring of the filter 1A. FIG. 11 is a cross-sectional view of a main wiring line 110A of the filter 1A when viewed along line XI-XI illustrated in FIG. 10A. FIG. 12 is a cross-sectional view of the main wiring line 110A of the filter 1A when viewed along line XII-XII illustrated in FIG. 10A.

As illustrated in FIG. 10A to FIG. 12, in the filter circuit 10 of the filter 1A of the modification, the insulating film 130 is in contact with the substrate 100, and the main wiring metal film 112 is on the insulating film 130. That is, in the filter 1A, the main wiring line 110 includes only the main wiring metal film 112.

The additional circuit 20 is the same as or similar to that of the preferred embodiment described above, and the cross-sectional view of the sub-wiring line 120 is the same or substantially the same as that illustrated in FIG. 7.

Also in the filter 1A of the modification, the insulating film 130 is provided between the substrate 100 and the sub-wiring line 120. According to this configuration, capacitive coupling between the main wiring line 110A of the filter circuit 10A and the sub-wiring line 120 of the additional circuit 20 via the substrate 100 can be reduced or prevented, and generation of a signal leakage path between the wiring lines can be reduces or prevented. Thus, attenuation outside a pass band of the filter 1A can be ensured.

Advantageous Effects and the Like

Advantageous effects and the like of the filter 1 of the above preferred embodiment and the filter 1A of the modification of the above preferred embodiment will be described in comparison with a comparative example. First, a configuration of a filter 501 of the comparative example will be described.

Figure 13A:
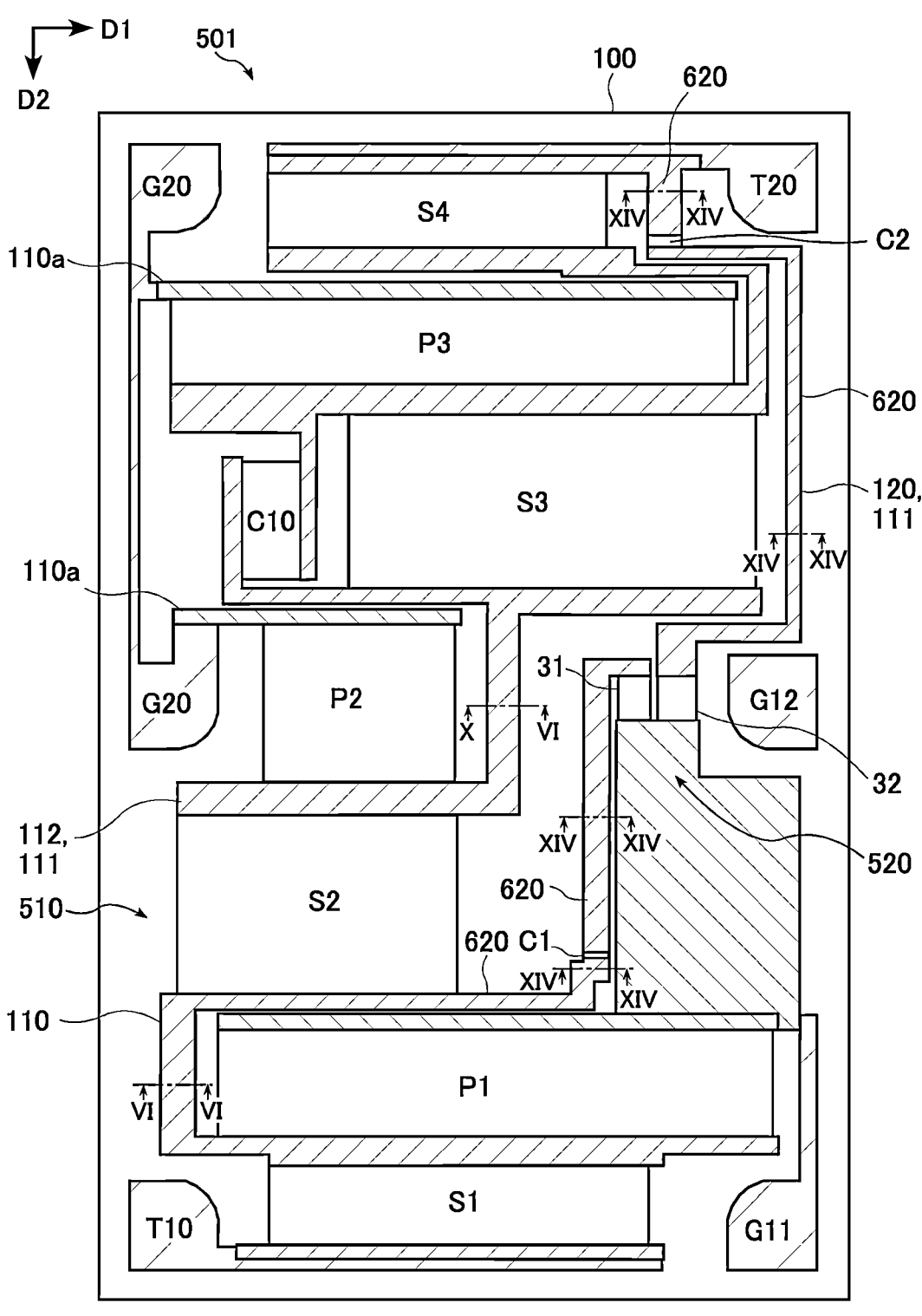
FIG. 13A is a plan view of a filter of a comparative example.
Figure 13B:
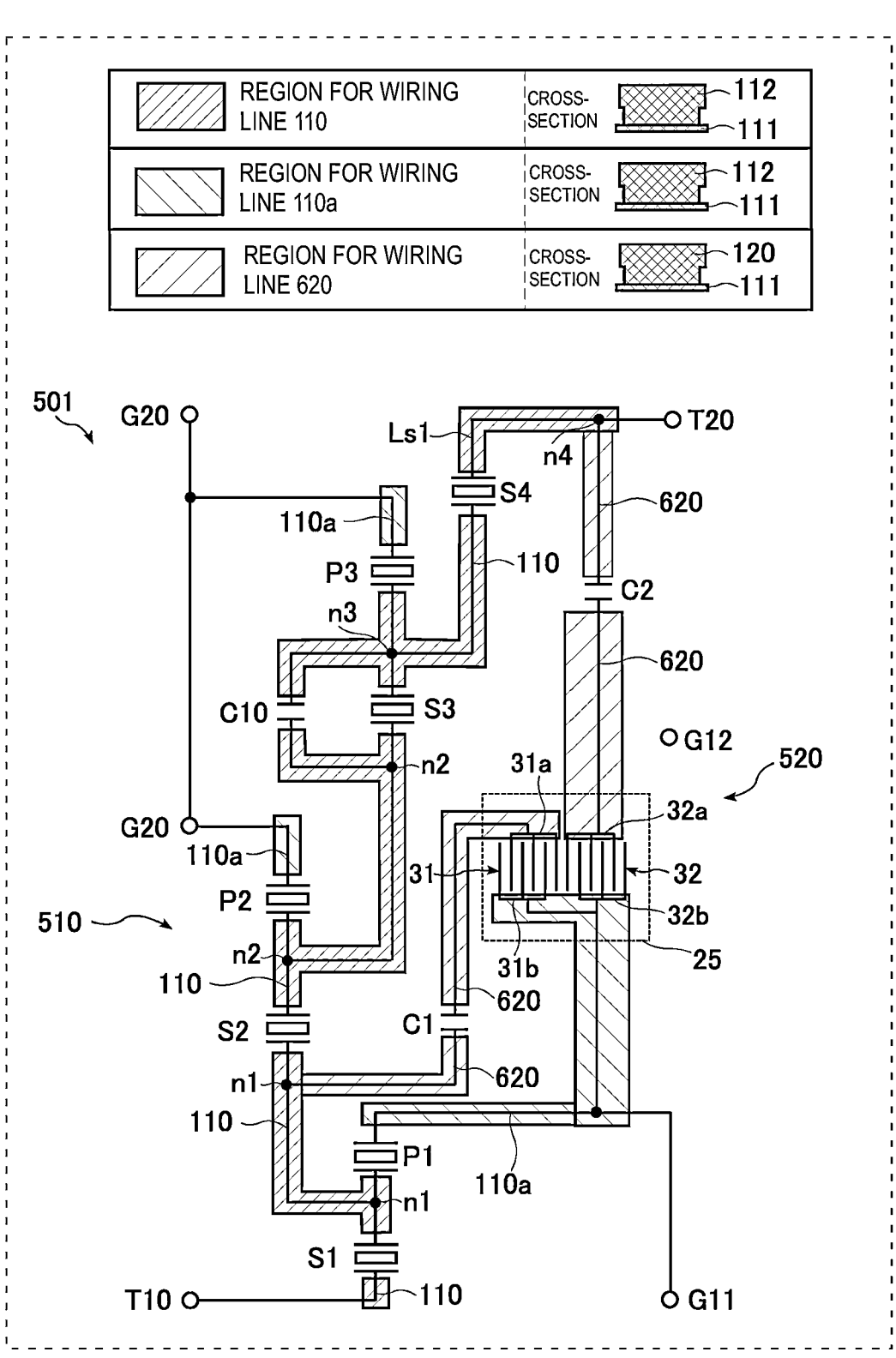
FIG. 13B is a diagram schematically illustrating wiring of the filter of the comparative example.
Figure 14:
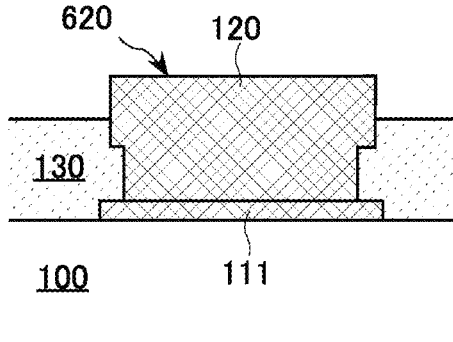
FIG. 14 is a cross-sectional view of wiring of an additional circuit of the filter of the comparative example when viewed along line XIV-XIV illustrated in FIG. 13A.

FIG. 13A is a plan view of the filter 501 of the comparative example. FIG. 13B is a diagram schematically illustrating wiring of the filter 501. FIG. 14 is a cross-sectional view of a wiring line 620 of an additional circuit 520 of the filter 501 when viewed along line XIV-XIV illustrated in FIG. 13A. A filter circuit 510 of the filter 501 is similar to that of the above preferred embodiment, and the description thereof will be omitted.

As illustrated in FIG. 13A to FIG. 14, in the filter 501 of the comparative example, the wiring line 620 of the additional circuit 520 includes the lower layer metal film 111 and the sub-wiring line 120. That is, in the comparative example, an insulating film is not provided between the substrate 100 and the sub-wiring line 120. In addition, in the comparative example, no ground wiring line is provided between substrate 100 and the sub-wiring line 120, and the wiring line 620 of the additional circuit 520 does not have a shielded structure.

In addition, in the additional circuit 520 of the comparative example, as illustrated in FIG. 13B, each of the one comb-shaped electrodes 31a and 32a adjacent to each other in the acoustic wave propagation direction D1 is connected to the wiring line 620 corresponding thereto, and both of the other comb-shaped electrodes 31b and 32b adjacent to each other in the acoustic wave propagation direction D1 are connected to the first ground electrode G11. That is, the comparative example also differs from the above preferred embodiment in that the ground electrode to which the other comb-shaped electrodes 31b and 32b are connected is not separated.

Bandpass characteristics of the filters of the above preferred embodiments, the modifications thereof, and the comparative example having the above-described configurations will be described with reference to FIG. 15.

Figure 15:
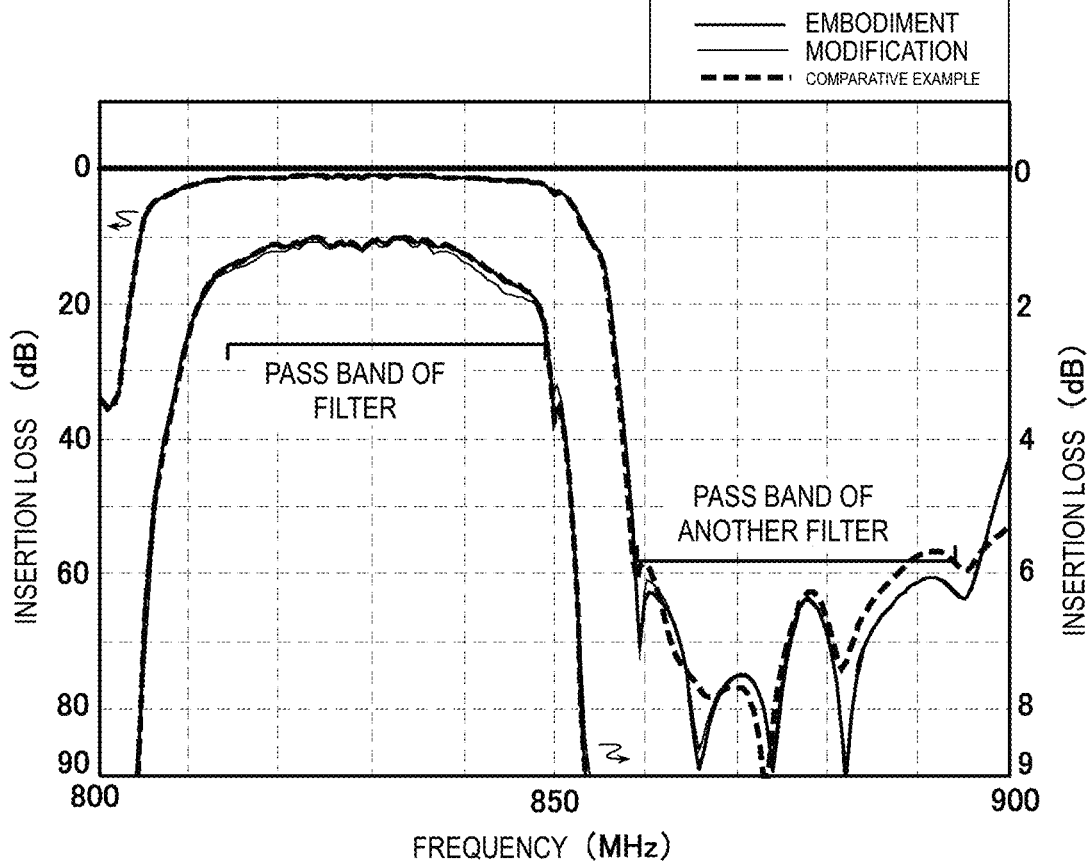
FIG. 15 is a graph showing bandpass characteristics of filters of preferred embodiments of the present invention, modifications thereof, and the comparative example.

FIG. 15 is a graph showing the bandpass characteristics of the filters 1, 1A, and 501 of the above preferred embodiments, the modifications thereof, and the comparative example. This graph shows an example in which the filters 1, 1A, and 501 are used as transmission filters, and the other filter 50 is used as a reception filter, and also shows an example in which a pass band of the transmission filter is from about 814 MHz to about 849 MHz and a pass band of the reception filter is from about 859 MHz to about 894 MHz.

As illustrated in FIG. 15, an insertion loss outside the pass band of each of the filters 1 and 1A of the above preferred embodiments and the modifications thereof (the pass band of the other filter 50) is about 60.6 dB, and an insertion loss outside a pass band of the filter 501 of the comparative example (the pass band of the other filter 50) is about 56.7 dB. As described above, in the above preferred embodiments and the modifications thereof, the attenuation outside the pass band of the filter can be more sufficiently ensured as compared with the comparative example.

Additionally, as illustrated in FIG. 15, the insertion loss in the pass band of the filter 1 of the above preferred embodiment is about 2.3 dB, and the insertion loss in the pass band of the filter 1A of the modification is about 2.5 dB. As described above, in the above preferred embodiment, the insertion loss in the pass band of the filter is smaller than that in the modification.

That is, the above preferred embodiment is superior to the comparative example in a comprehensive evaluation of the attenuation characteristics outside the pass band, a loss in the pass band and electric power handling capability.

In addition, in the filter 1 of the above preferred embodiment, the main wiring line 110 includes the multilayer film including the lower layer metal film 111 and the main wiring metal film 112, thus wiring resistance of the main wiring line 110 can be reduced as compared with the modification in which the main wiring line 110A includes only the main wiring metal film 112. In addition, in the filter 1 of the above preferred embodiment, it is possible to increase a contact cross-sectional area of the main wiring line 110 at a portion connected to the busbar 37a or 37b as compared with the modification. Thus, in the filter 1 of the above preferred embodiment, it is possible to reduce or prevent contact resistance as compared with the modification. Accordingly, with the filter 1, the occurrence of an insertion loss in the pass band can be reduced or prevented as compared with the modification.

SUMMARY

As described above, the filter 1 according to the present preferred embodiment includes the substrate 100 including the piezoelectric layer, and the first signal electrode T10 and the second signal electrode T20, the filter circuit 10 provided on the first path r1 connecting the first signal electrode T10 and the second signal electrode T20, and the additional circuit 20 provided on the second path r2 connected in parallel with at least a portion of the first path r1. The filter circuit 10 includes the one or more resonators and the main wiring line 110 that are provided on the substrate 100, and the additional circuit 20 includes the sub-wiring line 120 and the acoustically coupled resonator 25 that are provided on the substrate 100, the acoustically coupled resonator 25 having the plurality of acoustic wave resonators juxtaposed to each other. The insulating film 130 is provided between the substrate 100 and the sub-wiring line 120. The dielectric constant of the insulating film 130 is smaller than the dielectric constant of the piezoelectric layer.

As described above, by providing the insulating film 130 having the dielectric constant smaller than that of the piezoelectric layer between the substrate 100 and the sub-wiring line 120, it is possible to reduce or prevent capacitive coupling between the sub-wiring line 120 of the additional circuit 20 and the main wiring line 110 of the filter circuit 10 via the substrate 100. Thus, it is possible to reduce or prevent a signal leakage path generated between the sub-wiring line 120 and the main wiring line 110. Thus, the attenuation outside the pass band of the filter 1 can be ensured.

Further, the substrate 100 may further include a ground electrode, the ground wiring line 140 may be connected to the ground electrode, and the ground wiring line 140 may be provided between the substrate 100 and the insulating film 130.

According to this configuration, the ground wiring line 140 can be provided between the substrate 100 and the sub-wiring line 120. Thus, it is possible to reduce or prevent a signal leakage path generated between the sub-wiring line 120 of the additional circuit 20 and the main wiring line 110 of the filter circuit 10. Thus, the attenuation outside the pass band of the filter 1 can be ensured.

Further, the ground electrode includes the first ground electrode G11 and the second ground electrode G12 that is not electrically connected to the first ground electrode G11 on the substrate 100. The plurality of acoustic wave resonators include the first IDT electrode 31 and the second IDT electrode 32. Each of the first IDT electrode 31 and the second IDT electrode 32 includes the plurality of comb-shaped electrodes facing each other. The one comb-shaped electrode 31a included in the first IDT electrode 31 may be connected to the sub-wiring line 120, the other comb-shaped electrode 31b may be electrically connected to the second ground electrode G12, the one comb-shaped electrode 32a included in the second IDT electrode 32 may be connected to the sub-wiring line 120, and the other comb-shaped electrode 32b may be electrically connected to the first ground electrode G11.

As described above, the other comb-shaped electrodes 31b and 32b are separately connected to the second ground electrode G12 and the first ground electrode G11 which are not electrically connected to each other, respectively, so that the other comb-shaped electrodes 31b and 32b can be prevented from affecting each other via the ground electrodes. Thus, the attenuation outside the pass band of the filter 1 can be ensured.

Further, the sub-wiring line 120 includes the first sub-wiring line 121 connected to the one comb-shaped electrode 31a of the first IDT electrode 31 and the second sub-wiring line 122 connected to the one comb-shaped electrode 32a of the second IDT electrode 32. The ground wiring line 140 includes the first ground wiring line 141 connected to the first ground electrode G11, and the second ground wiring line 142 connected to the second ground electrode G12. The first ground wiring line 141 may be disposed between the substrate 100 and the insulating film 130 that is located between the substrate 100 and the first sub-wiring line 121, and the second ground wiring line 142 may be disposed between the substrate 100 and the insulating film 130 that is located between the substrate 100 and the second sub-wiring line 122.

As described above, the first ground wiring line 141 and the second ground wiring line 142 are separately connected to the first ground electrode G11 and the second ground electrode G12, respectively, so that mutual influence between the first ground wiring line 141 and the second ground wiring line 142 can be reduced or prevented. Thus, the attenuation outside the pass band of the filter 1 can be ensured.

Further, the substrate 100 may further include the other ground electrode G20 different from the first ground electrode G11 and the second ground electrode G12, the other ground electrode G20 may be connected to the filter circuit 10, and at least one of the first ground electrode G11 and the second ground electrode G12 need not be electrically connected to the other ground electrode G20 on the substrate 100.

According to this, it is possible to reduce or prevent mutual influence between at least one of the first ground electrode G11 and the second ground electrode G12, and the other ground electrode G20. Thus, the attenuation outside the pass band of the filter 1 can be ensured.

Further, when a dimension in the direction parallel or substantially parallel to the main surface 100a of the substrate 100 and perpendicular or substantially perpendicular to the direction in which the ground wiring line 140 extends is defined as a width, a width of the ground wiring line 140 may be greater than a width of the sub-wiring line 120.

According to this configuration, it is possible to more effectively reduce or prevent the signal leakage path generated between the sub-wiring line 120 of the additional circuit 20 and the main wiring line 110 of the filter circuit 10. Thus, the attenuation outside the pass band of the filter 1 can be ensured.

Additionally, at least a portion of the main wiring line 110 may include the lower layer metal film 111 provided on the substrate 100 and the main wiring metal film 112 provided on the lower layer metal film 111.

Since at least a portion of the main wiring line 110 includes the lower layer metal film 111 and the main wiring metal film 112 as described above, the wiring resistance of the main wiring line 110 can be reduced and a wiring loss can be reduced or prevented. Thus, occurrence of an insertion loss in the pass band of the filter 1 can be reduced or prevented.

Additionally, an entirety or substantially an entirety of the main wiring line 110 may include the lower layer metal film 111 provided on the substrate 100 and the main wiring metal film 112 provided on the lower layer metal film 111.

Since the entire or substantially the entire main wiring line 110 includes the lower layer metal film 111 and the main wiring metal film 112 as described above, the wiring resistance of the main wiring line 110 can be reduced and the wiring loss can be reduced. Thus, occurrence of an insertion loss in the pass band of the filter 1 can be reduced or prevented.

Further, the material of the ground wiring line 140 may be the same as the material of the lower layer metal film 111.

According to this, for example, the lower layer metal film 111 and the ground wiring line 140 can be formed simultaneously. Thus, a manufacturing cost of the filter 1 can be reduced.

Further, the material of the sub-wiring line 120 may be the same as the material of the main wiring metal film 112.

According to this, for example, the sub-wiring line 120 and the main wiring metal film 112 can be formed simultaneously. Thus, the manufacturing cost of the filter 1 can be reduced.

Further, the ground wiring line 140 may be in contact with the substrate 100.

According to this, it is possible to reduce or prevent the signal leakage path generated between the sub-wiring line 120 and the main wiring line 110 by using the ground wiring line 140 in contact with the substrate 100. Thus, the attenuation outside the pass band of the filter 1 can be ensured.

Additionally, it is sufficient that at least a portion of the sub-wiring line 120 is provided in the region 100b closest to the main wiring line 110 on the substrate 100.

According to this, it is possible to reduce or prevent the signal leakage path generated between the sub-wiring line 120 and the main wiring line 110 in the above-described closest region 100b. Thus, the attenuation outside the pass band of the filter 1 can be ensured.

Further, the additional circuit 20 may further include at least one capacitance element.

According to this, even when high power is applied to the filter 1, a current is reduced by passing through the at least one capacitance element (for example, the capacitance element C1), and it is possible to prevent the sub-wiring line 120 of the additional circuit 20 from being fused. In addition, since the sub-wiring line 120 can be prevented from being fused, the shielded structure in which the ground wiring line 140 is added to cover the sub-wiring line 120 can be obtained. Thus, the attenuation outside the pass band of the filter 1 can be ensured.

Alternatively, the filter 1 may be a surface acoustic wave filter.

Thus, attenuation outside a pass band of the surface acoustic wave filter can be ensured.

Further, the multiplexer 5 according to the present preferred embodiment includes the filter 1 described above, and the other filter 50 having bandpass characteristics different from those of the filter 1.

According to this, it is possible to provide the multiplexer 5 including the filter 1 for which the attenuation outside the pass band is ensured.

Other Preferred Embodiments

Although filters and multiplexers according to preferred embodiments of the present invention have been described with reference to the preferred embodiments and the modifications described above, the present invention includes other preferred embodiments achieved by combining components in the above preferred embodiments, modifications obtained by applying various modifications conceived by those skilled in the art to the above preferred embodiments without departing from the gist of the present invention, and a high-frequency front-end circuit and a communication device including the filter or the multiplexer.

In the above-described preferred embodiments, an example has been illustrated in which when the electrode of the acoustic wave resonator is provided on the substrate 100, the lower layer metal film 111 is structured so as to be in contact with the substrate 100, but the present invention is not limited thereto. For example, silicon oxide with a thickness of at least about 170 nm may be provided, between the substrate 100 and the lower layer metal film 111 to adjust frequency-temperature characteristics. The thickness of the insulating film 130 used in the present preferred embodiment is, for example, about 1700 nm, which is about ten times or more as thick as silicon oxide provided under the lower layer metal film 111.

Although an example has been illustrated in the above-described preferred embodiment in which the first sub-wiring line 121 of the additional circuit 20 is connected to the node n1, the present invention is not limited thereto, and the first sub-wiring line 121 may be connected to a node between the first signal terminal T1 and the series-arm resonator S1. However, when electric power handling capability of the additional circuit 20 is to be further improved, it is preferable that the first sub-wiring line 121 is not directly connected to the first signal terminal T1 to which a signal is inputted, but is connected to the node n1 present at a position where an input signal reaches after passing through the series-arm resonator S1.

Each of the capacitance elements C1 and C2 in the above-described preferred embodiment may include, for example, a pair of comb-shaped electrodes facing each other. In this case, the capacitance elements C1 and C2 may each include a pair of comb-shaped electrodes including a plurality of electrode fingers extending along the acoustic wave propagation direction D1 so as not to excite surface acoustic waves. An electrostatic capacitance of the capacitance element C1 may be smaller than an electrostatic capacitance of the IDT electrode 31 to which the capacitance element C1 is connected, or an electrostatic capacitance of the capacitance element C2 may be smaller than an electrostatic capacitance of the IDT electrode 32 to which the capacitance element C2 is connected.

Although an example has been illustrated in the preferred embodiment described above in which the acoustically coupled resonator 25 of the additional circuit 20 includes the two IDT electrodes, the present invention is not limited thereto, and the number of IDT electrodes included in the acoustically coupled resonator 25 may be equal to or greater than three.

Although an example has been illustrated in the above-described preferred embodiment in which the ground line Lg2 of the parallel-arm resonator P1 is connected to the ground electrode G11, the present invention is not limited thereto, and the ground line Lg2 of the parallel-arm resonator P1 may be connected to the other ground electrode G20. That is, all of the ground lines in the filter circuit 10 may be connected to the other ground electrode G20, and separated from the ground electrodes G11 and G12 connected to the additional circuit 20.

For example, the ground electrodes G11 and G12 may include the second metal film. Further, the first signal electrode T10, the second signal electrode T20, and the other ground electrode G20 may also be of the second metal film. Further, the first signal electrode T10, the second signal electrode T20, and the other ground electrode G20 may include a multilayer film including the first metal film and the second metal film.

Although an example has been illustrated in the above-described preferred embodiment in which the pass band of the filter 1 is set to be lower than the pass band of the other filter 50, the present invention is not limited thereto, and the pass band of the filter 1 may be set to be higher than the pass band of the other filter 50.

Although an example has been illustrated in the above preferred embodiment in which the filter 1 is the transmission filter, the present invention is not limited thereto, and the filter 1 may be a reception filter. Further, the multiplexer 5 is not limited to the configuration including both the transmission filter and the reception filter, and may include only the transmission filter or only the reception filter.

Further, the first signal terminal T1 and the second signal terminal T2 may each be any of an input terminal or an output terminal. For example, when the first signal terminal T1 is an input terminal, the second signal terminal T2 is to be an output terminal, and when the second signal terminal T2 is an input terminal, the first signal terminal T1 is to be an output terminal.

In addition, the filter circuit 10 and the other filter 50 are not limited to the configurations of the filters described above, and can be appropriately designed according to required filter characteristics or the like. Specifically, the filter circuit 10 and the other filter 50 are not limited to a ladder filter structure and may have a longitudinally coupled filter structure. Further, the resonators of the filter circuit 10 and the other filter 50 are not limited to SAW resonators, but may be BAW resonators, for example. Furthermore, the filter circuit 10 and the other filter 50 may be configured without using a resonator, and may be, for example, LC resonant filters or dielectric filters.

In addition, the materials for forming the insulating film 130 and the piezoelectric layer are not limited to the materials described above.

The insulating film 130 may be, for example, a film including an inorganic material such as silicon oxide, silicon nitride or silicon oxynitride as a main component, or a film including a resin material such as polyimide as a main component. In the preferred embodiment described above, an example has been illustrated in which lithium niobate is included as the piezoelectric material of the substrate 100, but the substrate 100 may be a substrate including lithium tantalate.

That is, the filter 1 according to the present preferred embodiment includes the substrate 100 including the piezoelectric layer, and the first signal electrode T10 and the second signal electrode T20, the filter circuit 10 provided on the first path r1 connecting the first signal electrode T10 and the second signal electrode T20, and the additional circuit 20 provided on the second path r2 connected in parallel with at least a portion of the first path r1. The filter circuit 10 includes the one or more resonators and the main wiring line 110 that are provided on the substrate 100, and the additional circuit 20 has the sub-wiring line 120 and the acoustically coupled resonator 25 that are provided on the substrate 100, the acoustically coupled resonator 25 including the plurality of acoustic wave resonators adjacent to each other. The insulating film 130 is provided between the substrate 100 and the sub-wiring line 120. The insulating film 130 includes, as a main component, any material selected from silicon oxide, silicon nitride, silicon oxynitride, and polyimide or a combination thereof, and the piezoelectric layer contains lithium niobate or lithium tantalate.

As described above, by providing the insulating film 130 including any material selected from, for example, silicon oxide, silicon nitride, silicon oxynitride, and polyimide or a combination thereof as a main component between the substrate 100 and the sub-wiring line 120, it is possible to reduce or prevent capacitive coupling between the sub-wiring line 120 of the additional circuit 20 and the main wiring line 110 of the filter circuit 10 via the substrate 100. Thus, it is possible to reduce the signal leakage path generated between the sub-wiring line 120 and the main wiring line 110. Thus, the attenuation outside the pass band of the filter 1 can be ensured.

Further, the materials of the IDT electrodes 31 and 32, and the electrode layer 102 of the reflector 28 are not limited to the materials described above. Further, the IDT electrodes 31 and 32 need not have the above-described laminated structure. The IDT electrodes 31 and 32 may include, for example, metal such as Ti, Al, Cu, Pt, Au, Ag or Pd or an alloy thereof or may include a plurality of laminated bodies made of the above-described metal or alloy.

Further, as for the substrate 100 on which the IDT electrodes 31 and 32 are provided, in addition to a structure entirely including a piezoelectric layer, a structure in which a piezoelectric layer is laminated on a support substrate may be used, as long as the structure has piezoelectricity. Furthermore, a structure in which at least one dielectric film is laminated between a support substrate and a piezoelectric layer may be used. Further, the cut-angle of the substrate 100 according to the above preferred embodiment is not limited. In other words, the laminated structure, the materials and the thicknesses may be changed as appropriate in accordance with bandpass characteristics required for the filter, and similar effects can be achieved even in a surface acoustic wave filter in which a LiTaO$_3$ piezoelectric substrate or a LiNbO$_3$ piezoelectric substrate having a cut-angle other than the cut-angle illustrated in the preferred embodiments described above is used.

Preferred embodiments of the present invention can be widely used as a multiplexer having a filter, a front-end circuit and a communication device, in communication equipment such as mobile phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter, comprising:
a substrate including a piezoelectric layer;
a first signal electrode and a second signal electrode;
a filter circuit on a first path connecting the first signal electrode and the second signal electrode; and
an additional circuit on a second path connected in parallel with at least a portion of the first path; wherein
the filter circuit includes one or more resonators and a main wiring line on the substrate;
the additional circuit includes a sub-wiring line and an acoustically coupled resonator on the substrate, the acoustically coupled resonator including a plurality of acoustic wave resonators adjacent to each other;
an insulating film is provided between the substrate and the sub-wiring line; and
a dielectric constant of the insulating film is smaller than a dielectric constant of the piezoelectric layer.

2. The filter according to claim 1, further comprising:
a ground electrode; and
a ground wiring line connected to the ground electrode; wherein
the ground wiring line is provided between the substrate and the insulating film.

3. The filter according to claim 2, wherein
the ground electrode includes a first ground electrode and a second ground electrode not electrically connected to the first ground electrode on the substrate;
the plurality of acoustic wave resonators include a first IDT electrode and a second IDT electrode;
each of the first IDT electrode and the second IDT electrode includes a plurality of comb-shaped electrodes facing each other;

one of the comb-shaped electrodes included in the first IDT electrode is connected to the sub-wiring line, and another of the comb-shaped electrodes is electrically connected to the second ground electrode; and one of the comb-shaped electrodes included in the second IDT electrode is connected to the sub-wiring line, and another of the comb-shaped electrodes is electrically connected to the first ground electrode.

4. The filter according to claim 3, wherein the sub-wiring line includes a first sub-wiring line connected to the one of the comb-shaped electrodes of the first IDT electrode and a second sub-wiring line connected to the one of the comb-shaped electrodes of the second IDT electrode;

the ground wiring line includes a first ground wiring line connected to the first ground electrode, and a second ground wiring line connected to the second ground electrode;

the first ground wiring line is between the substrate and the insulating film located between the substrate and the first sub-wiring line; and the second ground wiring line is between the substrate and the insulating film located between the substrate and the second sub-wiring line.

5. The filter according to claim 3, further comprising:

another ground electrode different from the first ground electrode and the second ground electrode; wherein the another ground electrode is connected to the filter circuit; and at least one of the first ground electrode and the second ground electrode is not electrically connected to the another ground electrode on the substrate.

6. The filter according to claim 3, wherein when a dimension in a direction parallel or substantially parallel to a main surface of the substrate and perpendicular or substantially perpendicular to a direction in which the ground wiring line extends is defined as a width, a width of the ground wiring line is greater than a width of the sub-wiring line.

7. The filter according to claim 3, wherein at least a portion of the main wiring line includes a lower layer metal film on the substrate and a main wiring metal film on the lower layer metal film.

8. The filter according to claim 3, wherein an entirety or substantially an entirety of the main wiring line includes a lower layer metal film on the substrate and a main wiring metal film on the lower layer metal film.

9. The filter according to claim 7, wherein a material of the ground wiring line is same as a material of the lower layer metal film.

10. The filter according to claim 7, wherein a material of the sub-wiring line is same as a material of the main wiring metal film.

11. The filter according to claim 2, wherein the ground wiring line is in contact with the substrate.

12. The filter according to claim 1, wherein at least a portion of the sub-wiring line is provided in a region closest to the main wiring line on the substrate.

13. The filter according to claim 1, wherein the additional circuit further includes at least one capacitance element.

14. The filter according to claim 1, wherein the filter is a surface acoustic wave filter.

15. A multiplexer, comprising:

the filter according to claim 1; and another filter having bandpass characteristics different from bandpass characteristics of the filter.

16. The multiplexer according to claim 15, further comprising:

a ground electrode; and a ground wiring line connected to the ground electrode; wherein the ground wiring line is provided between the substrate and the insulating film.

17. The multiplexer according to claim 16, wherein the ground electrode includes a first ground electrode and a second ground electrode not electrically connected to the first ground electrode on the substrate;

the plurality of acoustic wave resonators include a first IDT electrode and a second IDT electrode;

each of the first IDT electrode and the second IDT electrode includes a plurality of comb-shaped electrodes facing each other;

one of the comb-shaped electrodes included in the first IDT electrode is connected to the sub-wiring line, and another of the comb-shaped electrodes is electrically connected to the second ground electrode; and one of the comb-shaped electrodes included in the second IDT electrode is connected to the sub-wiring line, and another of the comb-shaped electrodes is electrically connected to the first ground electrode.

18. The multiplexer according to claim 17, wherein the sub-wiring line includes a first sub-wiring line connected to the one of the comb-shaped electrodes of the first IDT electrode and a second sub-wiring line connected to the one of the comb-shaped electrodes of the second IDT electrode;

the ground wiring line includes a first ground wiring line connected to the first ground electrode, and a second ground wiring line connected to the second ground electrode;

the first ground wiring line is between the substrate and the insulating film located between the substrate and the first sub-wiring line; and the second ground wiring line is between the substrate and the insulating film located between the substrate and the second sub-wiring line.

19. The multiplexer according to claim 17, further comprising:

another ground electrode different from the first ground electrode and the second ground electrode; wherein the another ground electrode is connected to the filter circuit; and at least one of the first ground electrode and the second ground electrode is not electrically connected to the another ground electrode on the substrate.

20. A filter, comprising:

a substrate including a piezoelectric layer;

a first signal electrode and a second signal electrode;

a filter circuit on a first path connecting the first signal electrode and the second signal electrode; and an additional circuit on a second path connected in parallel with at least a portion of the first path; wherein the filter circuit includes one or more resonators and a main wiring line on the substrate;

the additional circuit includes a sub-wiring line and an acoustically coupled resonator on the substrate, the acoustically coupled resonator including a plurality of acoustic wave resonators adjacent to each other;

an insulating film is provided between the substrate and the sub-wiring line;

the insulating film includes, as a main component, at least one of silicon oxide, silicon nitride, silicon oxynitride, or polyimide or a combination thereof; and the piezoelectric layer includes lithium niobate or lithium tantalate.

\* \* \* \* \*